US012689382B2

(12) United States Patent
Arcudia et al.

(10) Patent No.: US 12,689,382 B2
(45) Date of Patent: Jul. 21, 2026

(54) INJECTION LOCKING OSCILLATOR WITH PHASE ROTATION CAPABILITY

(71) Applicant: QUALCOMM Incorporated, San Diego, CA (US)

(72) Inventors: Kenneth Luis Arcudia, Cary, NC (US); Baptiste Grave, Shanagarry (IE); Robert David Froggatt, Cork City (IE)

(73) Assignee: QUALCOMM INCORPORATED, San Diego, CA (US)

( * ) Notice: Subject to any disclaimer, the term of this patent is extended or adjusted under 35 U.S.C. 154(b) by 24 days.

(21) Appl. No.: 18/732,100

(22) Filed: Jun. 3, 2024

(65) Prior Publication Data

US 2025/0373256 A1      Dec. 4, 2025

(51) Int. Cl.
 *H03L 7/24* (2006.01)
 *H03L 7/099* (2006.01)

(52) U.S. Cl.
 CPC ............... *H03L 7/24* (2013.01); *H03L 7/099* (2013.01)

(58) Field of Classification Search
 USPC .......................................................... 331/45
 See application file for complete search history.

(56) References Cited

U.S. PATENT DOCUMENTS 5,841,325 A * 11/1998 Knotts ................. H03K 3/0231
                                                           331/177 R
6,094,103 A     7/2000 Jeong et al.

| | | | |
|---|---|---|---|
| 7,078,979 B2 | 7/2006 | Dally et al. | |
| 8,508,309 B2 * | 8/2013 | McCune, Jr. ........... | H04L 27/20 |
| | | | 332/103 |
| 10,014,868 B1 * | 7/2018 | Raj ........................... | H03L 7/24 |
| 10,396,807 B1 * | 8/2019 | Dai ........................... | H03L 7/07 |
| 10,498,345 B1 | 12/2019 | Rakshit et al. | |
| 2015/0188554 A1 * | 7/2015 | Chong ................. | H03K 3/0315 |
| | | | 327/158 |
| 2022/0140831 A1 | 5/2022 | Van Den Heuvel et al. | |
| 2022/0244755 A1 | 8/2022 | Wang et al. | |
| 2025/0080089 A1 * | 3/2025 | Grave ................. | H03K 3/0315 |

OTHER PUBLICATIONS

Huang Y.-C., et al., "An 8b Injection-Locked Phase Rotator with Dynamic Multiphase Injection for 28/56/112Gb/s Serdes Application", IEEE International Solid-State Circuits Conference 2019, Session 30, Advanced Wireline Techniques, 30.7, Feb. 17-21, 2019, 3 Pages.

(Continued)

*Primary Examiner* — Joseph Chang
(74) *Attorney, Agent, or Firm* — Loza & Loza, LLP

(57) ABSTRACT

A system includes an oscillator and an injection circuit coupled to the oscillator. The injection circuit includes a first injection branch coupled to a node, wherein the first injection branch is configured to receive a first clock signal and generate a first injection current based on the first clock signal. The injection circuit also includes a second injection branch coupled to the node, wherein the second injection branch is configured to receive a second clock signal and generate a second injection current based on the second clock signal, and wherein the first injection current and the second injection current are combined at the node.

22 Claims, 17 Drawing Sheets

(56)        References Cited

OTHER PUBLICATIONS

Zhang Y.F., et al., "Design Considerations for Time-Modulated Injection-Locked Phase Interpolators and Rotators", IEEE International Symposium on Circuits and Systems 2022, May 27, 2022-Jun. 1, 2022, pp. 1719-1723.
International Search Report and Written Opinion—PCT/US2025/025450—ISA/EPO—Jul. 30, 2025.
Mahony F O' et al., "A Programmable Phase Rotator Based on Time-modulated Injection-locking", VLSI Circuits (VLSIC), IEEE Symposium on, Piscataway, NJ, USA, Jun. 16, 2010, pp. 45-46, XP031744527, ISBN: 978-1-4244-5454-9, Figures 1-6.

* cited by examiner

INJECTION LOCKING OSCILLATOR WITH PHASE ROTATION CAPABILITY

BACKGROUND

Field

Aspects of the present disclosure relate generally to oscillators, and more particularly, to injection locking oscillators.

Background

An injection locking oscillator (also referred to as an injection-locked oscillator) may be used to generate one or more clock signals that are synchronized with one or more external clock signals injected into the injection locking oscillator. The injection locking oscillator may be used, for example, to generate one or more sampling clock signals for sampling a data signal received from a high-speed link (e.g., a high-speed serial link). The injection locking oscillator may also be used in other applications requiring one or more clock signals for timing.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes an oscillator and an injection circuit coupled to the oscillator. The injection circuit includes a first injection branch coupled to a node, wherein the first injection branch is configured to receive a first clock signal and generate a first injection current based on the first clock signal. The injection circuit also includes a second injection branch coupled to the node, wherein the second injection branch is configured to receive a second clock signal and generate a second injection current based on the second clock signal, and wherein the first injection current and the second injection current are combined at the node.

A second aspect relates to a method for injection locking. The method includes receiving a first clock signal, generating a first injection current based on the first clock signal, receiving a second clock signal, generating a second injection current based on the second clock signal, combining the first injection current and the second injection current to obtain a combined injection current, and coupling the combined injection current to an oscillator.

A third aspect relates to an apparatus for injection locking. The apparatus includes means for receiving a first clock signal, means for generating a first injection current based on the first clock signal, means for receiving a second clock signal, means for generating a second injection current based on the second clock signal, means for combining the first injection current and the second injection current to obtain a combined injection current, and means for coupling the combined injection current to an oscillator.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
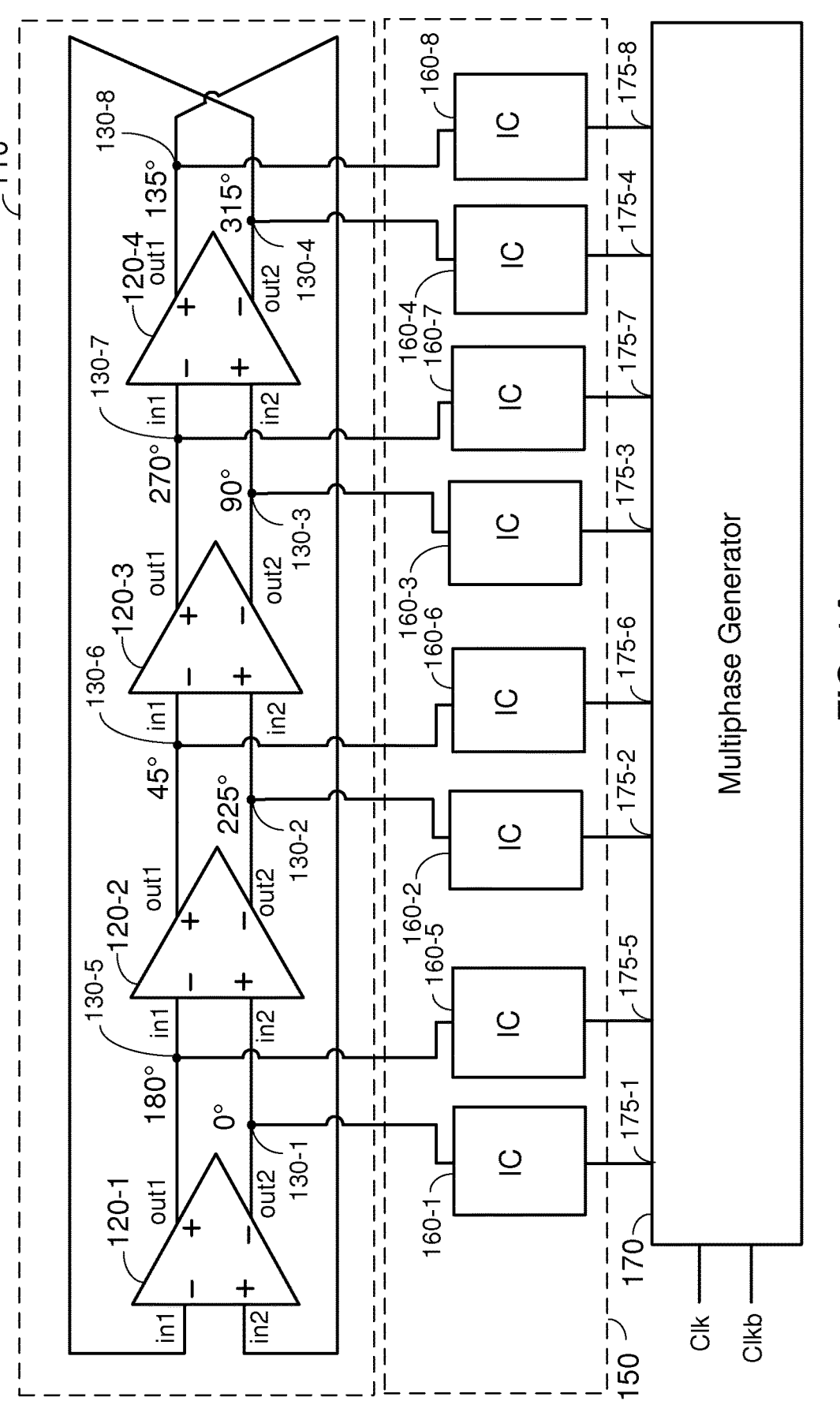
FIG. 1A shows an example of an injection locking oscillator according to certain aspects of the present disclosure.

FIG. 1A shows an example of an injection locking oscillator 110 (also referred to as an injection-locked oscillator), a multiphase injection circuit 150, and a multiphase generator 170 according to certain aspects of the present disclosure.

In this example, the injection locking oscillator 110 includes multiple stages 120-1 to 120-4. As discussed further below, the stages 120-1 to 120-4 are coupled in a loop to produce oscillation. Although four stages 120-1 to 120-4 are shown in the example in FIG. 1A, it is to be appreciated that the injection locking oscillator 110 may include a different number of stages in other implementations.

In this example, each of the stages 120-1 to 120-4 has a first input (labeled "in1"), a second input (labeled "in2"), a first output (labeled "out1"), and a second output (labeled "out2"). The first output of each of the stages 120-1 to 120-3 is coupled to the first input of the next one of the stages 120-2 to 120-4 in the injection locking oscillator 110. The first output of the last stage 120-4 is coupled to the second input of the first stage 120-1. The second output of each of the stages 120-1 to 120-3 is coupled to the second input of the next one of the stages 120-2 to 120-4 in the injection locking oscillator 110. Finally, the second output of the last stage 120-4 is coupled to the first input of the first stage 120-1. As a result, the stages 120-1 to 120-4 are coupled in a loop in which the loop passes through each of the stages 120-1 to 120-4 twice (i.e., once between the first input and first output of the stage and once between the second input and the second output of the stage).

In this example, the natural frequency of the injection locking oscillator 110 depends on the delays of the stages 120-1 to 120-4. As used herein, the "natural frequency" of the injection locking oscillator 110 is the frequency of the injection locking oscillator 110 without injection. As discussed further below, the injection locking oscillator 110 may be synchronized (i.e., locked) with one or more external clock signals injected into the injection locking oscillator 110 when the one or more external clock signals have a frequency within a locking range of the natural frequency. As used herein, a "clock signal" is a periodic signal that oscillates between a high state (e.g., a supply voltage) and a low state (e.g., ground potential).

In the example in FIG. 1A, the injection locking oscillator 110 has multiple nodes 130-1 to 130-8 located at different locations on the loop of the injection locking oscillator 110, in which the nodes are separated by the stages 120-1 to 120-4. Although eight nodes (i.e., the nodes 130-1 to 130-8) are shown in the example in FIG. 1A, it is to be appreciated that the injection locking oscillator 110 may have a different number of nodes in other implementations. As discussed further below with reference to FIG. 1B, a buffer circuit may be coupled to the nodes 130-1 to 130-8.

The multiphase generator 170 is configured to receive a first input clock signal Clk and a second input clock signal Clkb having the same frequency. The second input clock signal Clkb may be phase offset from the first input clock signal Clk by 180 degrees (i.e., the second input clock signal Clkb may be the complement of the first input clock signal Clk). In certain aspects, the first and second input clock signals Clk and Clkb are received from a clock link (e.g., a differential clock link), as discussed further below.

The multiphase generator 170 is configured to generate multiple clock signals based on the first and second input clock signals Clk and Clkb, in which the multiple clock signals have the same frequency as the first and second input clock signals Clk and Clkb and are phase offset from one another (e.g., by 45 degrees). In this regard, the multiple clock signals may also be referred to as multiple clock phases. In the example shown in FIG. 1A, the multiphase generator 170 is configured to generate eight clock signals (i.e., eight clock phases) with a phase offset of 45 degrees (i.e., 45°) between the clock signals. However, it is to be appreciated that the present disclosure is not limited to this example. The multiphase generator 170 may be implemented with a polyphase filter (e.g., a resistor-capacitor (RC) polyphase filter), a delay locked loop (DLL), or another type of circuit capable of generating multiple clock phases. The clock signals generated by the multiphase generator 170 may also be referred to as multiphase clock signals since the generated clock signals have different phases.

The multiphase generator 170 outputs the multiphase clock signals (e.g., eight clock phases) from respective outputs 175-1 to 175-8 of the multiphase generator 170. In this example, the phase offset between the multiphase clock signals is 45 degrees (i.e., 45°) resulting in clock phases of 0°, 45°, 90°, 135°, 180°, 225°, 270°, and 315°. However, it is to be appreciated that the present disclosure is not limited to this example.

The multiphase injection circuit 150 is configured to receive the multiphase clock signals from the multiphase generator 170 and inject the multiphase clock signals into the injection locking oscillator 110 to synchronize the injection locking oscillator 110 with the multiphase clock signals within the limits of the locking range of the injection locking oscillator 110. In this example, the multiphase injection circuit 150 includes injection circuits 160-1 to 160-8 where each of the injection circuits 160-1 to 160-8 is coupled between a respective one of the outputs 175-1 to 175-8 of the multiphase generator 170 and a respective one of the nodes 130-1 to 130-8 of the injection locking oscillator 110. Each of the injection circuits 160-1 to 160-8 is configured to receive a respective one of the multiphase clock signals (i.e., a respective one of the clock phases) from the respective one of the outputs 175-1 to 175-8 of the multiphase generator 170, and inject the respective one of the multiphase clock signals into the respective one of the nodes 130-1 to 130-8 of the injection locking oscillator 110. An injection circuit may also be referred to as an injection cell or another term. Thus, the injection circuits 160-1 to 168-8 inject the multiphase clock signals from the multiphase generator 170 into the respective nodes 130-1 to 130-8 of the injection locking oscillator 110.

Without injection, the injection locking oscillator 110 is configured to provide eight phases spaced 45° apart at the natural frequency of the oscillator. In this example, the injection of the multiphase clock signals from the multiphase generator 170 into the injection locking oscillator 110 synchronizes the frequency of the injection locking oscillator 110 with the frequency of the multiphase clock signals (also referred to as the injection frequency). After injection, this provides eight phases spaced 45° apart at the injection frequency. However, it is to be appreciated that the present disclosure is not limited to this example.

In the example in FIG. 1A, the clock phases are 0°, 225°, 90°, 315°, 180°, 45°, 270°, and 135° at the nodes 130-1, 130-2, 130-3, 130-4, 130-5, 130-6, 130-7, and 130-8, respectively. This is because the stages 120-1 to 120-4 are inverting in this example. For example, without inversion, the phase difference between the nodes 130-1 and 130-2 would be 45°. The inversion of the second stage 120-2 (which is between the nodes 130-1 and 130-2) adds a phase shift of 180°, resulting in a total phase difference of 225° between the nodes 130-1 and 130-2. It is to be appreciated that the stages 120-1 to 120-4 may be non-inverting in other implementations. In either case, the injection locking oscillator 110 in this example provides eight clock phases spaced 45° apart at the injection frequency.

Figure 1B:
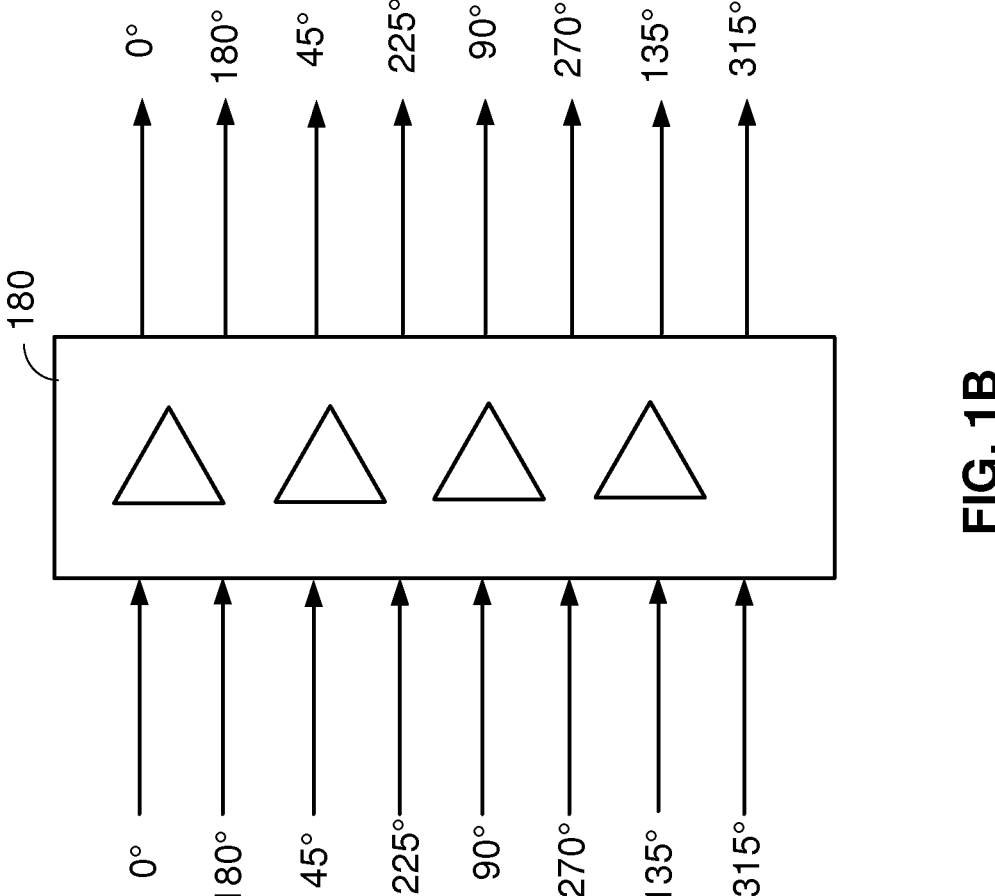
FIG. 1B shows an example of a buffer circuit that may be coupled to the injection locking oscillator of FIG. 1A according to certain aspects of the present disclosure.

FIG. 1B shows an example of a buffer circuit 180 that may be coupled to the nodes 130-1 to 130-8 of the injection locking oscillator 110 according to certain aspects. The buffer circuit 180 is configured to receive the clock phases from the injection locking oscillator 110 and drive the next stage (e.g., a phase interpolator, a sampler, etc.) with the clock phases. The buffer circuit 180 may include multiple buffers (e.g., one for each clock phase), but is not limited to this example. It is to be appreciated that the buffer circuit 180 is not limited to the exemplary arrangement of the clock phases shown in FIG. 1B, and that the buffer circuit 180 may receive and output the clock phases in any arrangement.

In some implementations, the buffer circuit 180 may be inverting in which the buffer circuit 180 shifts each of the clock phases from the injection locking oscillator 110 by 180°. In these implementations, the buffer circuit 180 still outputs eight clock phases spaced 45° apart at the injection frequency since all of the clock phases are shifted by the same amount (i.e., 180°). Thus, the buffer circuit 180 may be implemented with an inverting buffer circuit or a non-inverting buffer circuit.

Figure 2:
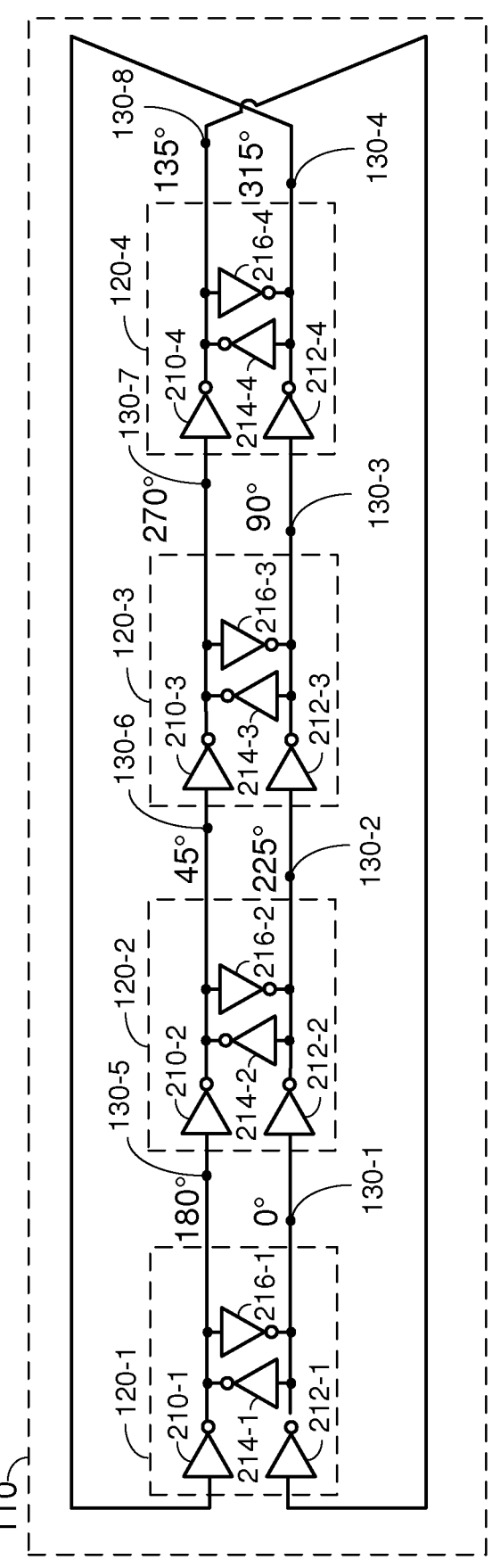
FIG. 2 shows an exemplary implementation of stages in the injection locking oscillator of FIG. 1A according to certain aspects of the present disclosure.

FIG. 2 shows an exemplary implementation of the stages 120-1 to 120-4 according to certain aspects. Note that the multiphase injection circuit 150 and the multiphase generator 170 are not shown in FIG. 2 for ease of illustration. In this example, each of the stages 120-1 to 120-4 is implemented with an inverter-based differential amplifier including a respective first inverter 210-1 to 210-4, a respective second inverter 212-1 to 212-4, a respective third inverter 214-1 to 214-4, and a respective fourth inverter 216-1 to 216-4. In each of the stages 120-1 to 120-4, the respective first inverter 210-1 to 210-4 is coupled between the first input and the first output of the stage, and the respective second inverter 212-1 to 212-4 is coupled between the second input and the second output of the stage, as shown in FIG. 2. Also, in each of the stages 120-1 to 120-4, the respective third inverter 214-1 to 214-4 and the respective fourth inverter 216-1 to 216-4 are cross-coupled between the first output and the second output of the stage, as shown in FIG. 2. The cross-coupled inverters help the loop to oscillate.

It is to be appreciated that the stages 120-1 to 120-4 are not limited to the exemplary implementation shown in FIG. 2. For example, the stages 120-1 to 120-4 may be implemented with other arrangements of inverters and/or implemented with other types of amplifiers (e.g., different amplifiers). In other words, FIG. 2 illustrates just one possible implementation of the stages 120-1 to 120-4.

Figure 3:
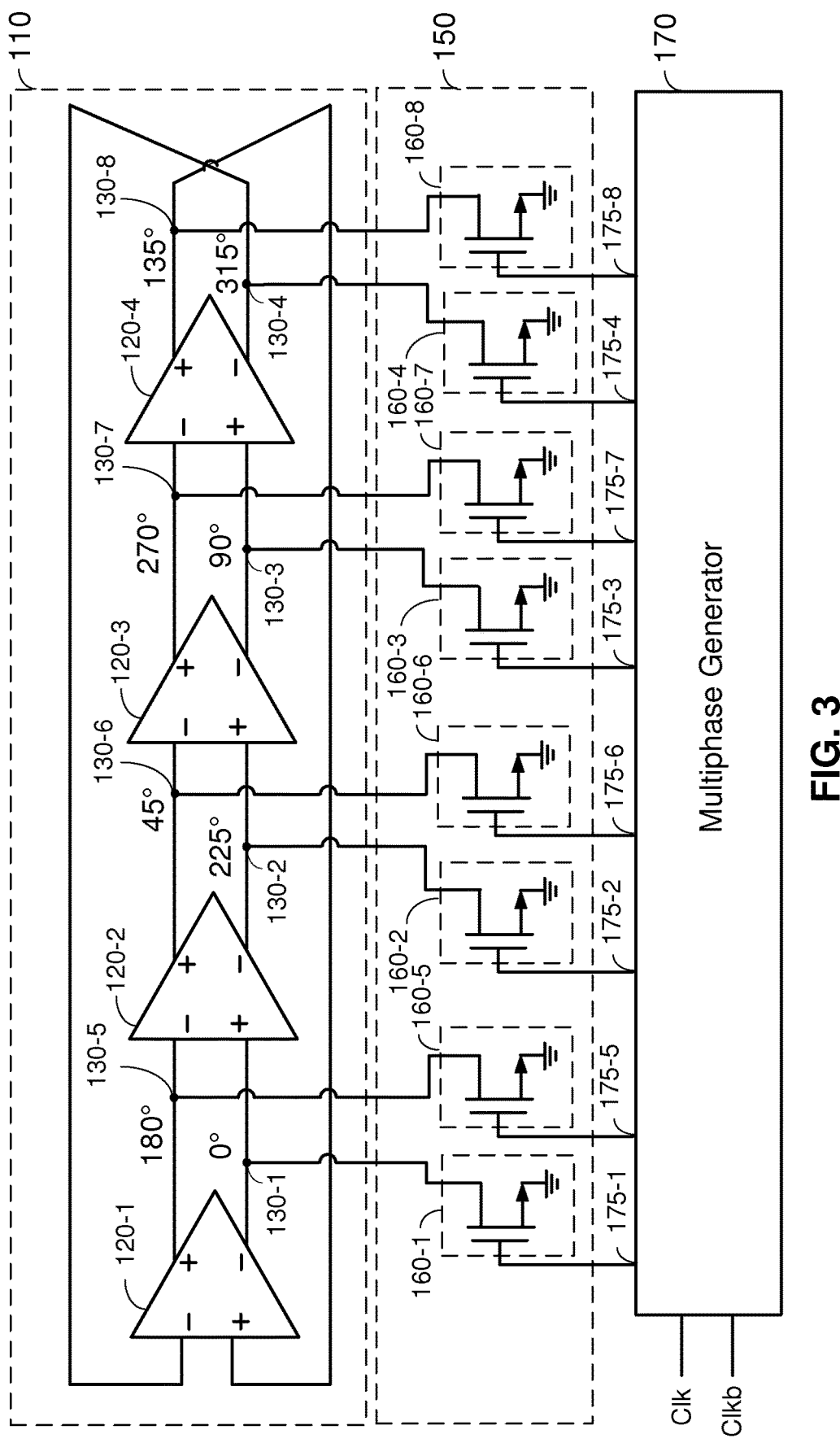
FIG. 3 shows an exemplary implementation of a multiphase injection circuit according to certain aspects of the present disclosure.

FIG. 3 shows an exemplary implementation of the injection circuits 160-1 to 160-8 according to certain aspects. In this example, each of the injection circuits 160-1 to 160-8 includes a respective n-type field effect transistor (NFET) having a gate coupled to the respective one of the outputs 175-1 to 175-8 of the multiphase generator 170, a drain coupled to the respective one of the nodes 130-1 to 130-8 of the injection locking oscillator 110, and a source coupled to ground. Thus, in each of the injection circuits 160-1 to

160-8, the gate of the respective NFET is driven by the respective one of the multiphase clock signals (i.e., the respective one of the clock phases) from the multiphase generator 170. As a result, in each of the injection circuits 160-1 to 160-8, the respective NFET pulls the respective one of the nodes 130-1 to 130-8 low (e.g., to ground potential) when the respective one of the multiphase clock signals is high (e.g., supply voltage). However, it is to be appreciated that the injection circuits 160-1 to 160-8 are not limited to this example. In some implementations, each of the injection circuits 160-1 to 160-8 may also include a respective transistor (not shown) coupled in series with the respective NFET (e.g., for adjusting the injection strength of the injection circuit by adjusting the conductance of the respective transistor).

In this example, the injection circuits 160-1 to 160-8 are inverting since each of the injection circuits 160-1 to 160-8 pulls the respective one of the nodes 130-1 to 130-8 low when the respective one of the multiphase clock signals is high. Thus, to inject the node 130-1 with the clock phase 0°, the gate of the respective NFET may be driven by the clock phase 180° from the multiphase generator 170. To inject the node 130-2 with the clock phase 225°, the gate of the respective NFET may be driven by the clock phase 45° from the multiphase generator 170, and so forth. However, it is to be appreciated that the present disclosure is not limited to this example. In other implementations, the injection circuits 160-1 to 160-8 may be non-inverting. In other words, the present disclosure is not limited to a particular polarity for the injection circuits 160-1 to 160-1 as long as the relative phases between the nodes 130-1 to 130-8 are maintained.

Figure 4:
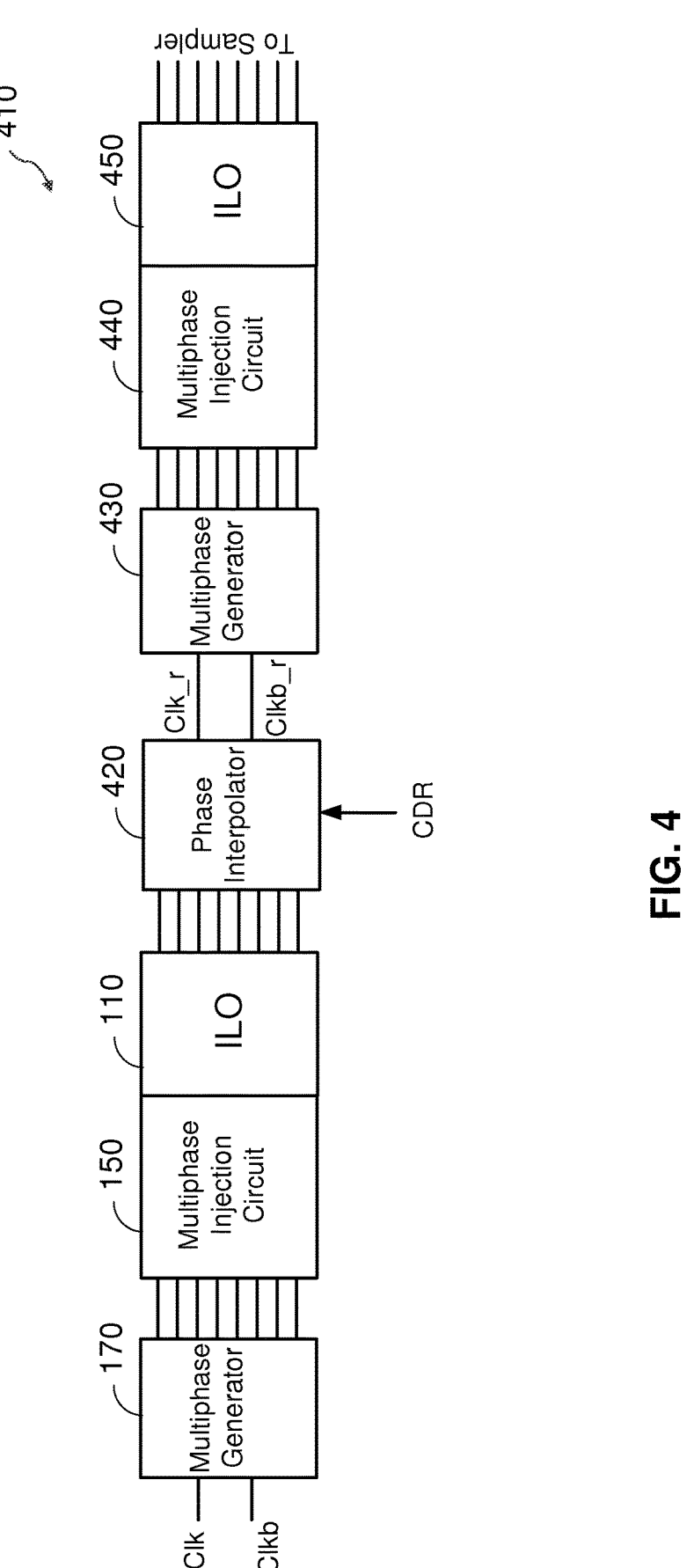
FIG. 4 shows an example of a sampling clock generator for data sampling according to certain aspects of the present disclosure.

In certain aspects, the injection locking oscillator 110 may be used to generate sampling clock signals for sampling a data signal received from a high-speed link (e.g., a high-speed serial link). In this regard, FIG. 4 shows an example of a sampling clock generator 410 for generating sampling clock signals for a data sampler 525 (shown in FIG. 5A). In this example, the sampling clock generator 410 includes the multiphase generator 170, the multiphase injection circuit 150, and the injection locking oscillator 110 discussed above. The sampling clock generator 410 also includes a phase interpolator 420, a second multiphase generator 430, a second multiphase injection circuit 440, and a second injection locking oscillator 450. The second multiphase generator 430 may be a second instance (i.e., a second copy) of the multiphase generator 170, the second multiphase injection circuit 440 may be a second instance of the multiphase injection circuit 150, and the second injection locking oscillator 450 may be a second instance of the injection locking oscillator 110. However, it is to be appreciated that the present disclosure is not limited to this example.

In operation, the multiphase generator 170, the multiphase injection circuit 150, and the injection locking oscillator 110 convert the input clock signals Clk and Clkb into eight clock phases that are spaced apart by 45 degrees (i.e., eight clock signals that are phase offset from one another by 45 degrees). The eight clock phases are input to the phase interpolator 420. In some implementations, a buffer circuit (an instance of the buffer circuit 180 in FIG. 1B) may be placed between the injection locking oscillator 110 and the phase interpolator 420 to drive the phase interpolator 420 with the clock phases.

The phase interpolator 420 performs phase interpolation using the clock phases from the injection locking oscillator 110 and timing information from a clock data recovery (CDR) circuit 530 (shown in FIG. 5A) to generate a first phase-rotated clock signal Clk_r and a second phase-rotated clock Clkb_r that are aligned with a data signal (e.g., a serial data stream). In this disclosure, a clock signal may be aligned with a data signal when an edge (e.g., a rising edge) of the clock signal is aligned with a data transition in the data signal or the edge of the clock signal is centrally aligned between two adjacent data transitions in the data signal. In this example, the CDR circuit 530 provides the phase interpolator 420 with timing information on the data signal so that the phase interpolator 420 can align the first and second phase-rotated clock signals Clk_r and Clkb_r with the data signal.

The second multiphase generator 430, the second multiphase injection circuit 440, and the second injection locking oscillator 450 convert the first and second phase-rotated clock signals Clk_r and Clkb_r into eight clock phases that are spaced apart by 45 degrees and are aligned with the data signal (i.e., eight clock signals that are phase offset from one another by 45 degrees and are aligned with the data signal). In some implementations, a buffer circuit (an instance of the buffer circuit 180 in FIG. 1B) may be placed between the second injection locking oscillator 450 and the data sampler 525 (shown in FIG. 5A) to drive the sampler with the clock phases.

Figure 5A:
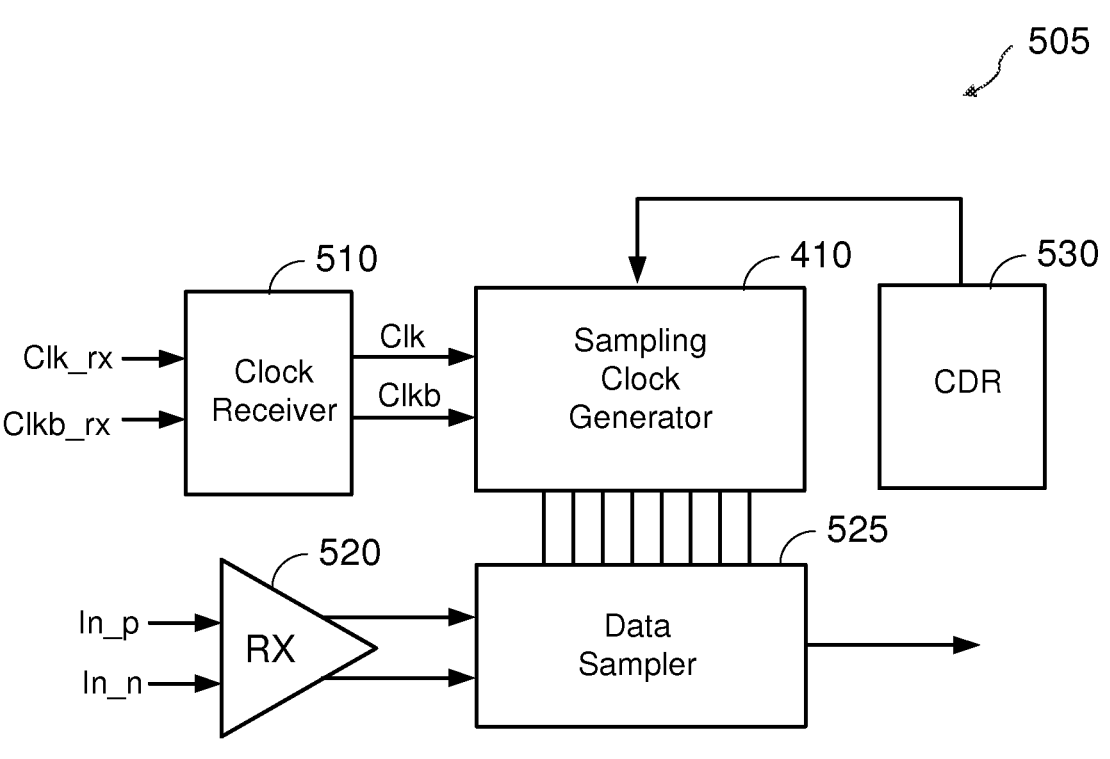
FIG. 5A shows an example of a system including the sampling clock generator of FIG. 4 according to certain aspects of the present disclosure.

FIG. 5A shows an example of a system 505 including a clock receiver 510, the sampling clock generator 410, the CDR circuit 530, a data receiver 520, and the data sampler 525. The system 505 is integrated on a chip and may be used to facilitate chip-to-chip communication between the chip and another chip.

The clock receiver 510 is configured to receive clock signals Clk_rx and Clkb_rx from the other chip via a clock link (e.g., a differential clock link), and output the received clock signals to the sampling clock generator 410. The data receiver 520 is configured to receive a data signal (e.g., a serial data signal) from the other chip via a data link (e.g., a serial data link). In certain aspects, the data signal may be a differential data signal including a first signal in_p and a second signal in_n. In this example, the data signal may transport data using data symbols where the polarity and/or the magnitude of each data symbol represents one or more data bits.

The data receiver 520 may process the data signal and output the processed data signal to the data sampler 525. The data receiver 520 may include one or more of the following: an impedance matching network, a continuous time linear equalizer (CTLE) to compensate for high frequency attenuation in the link, and the like.

The data sampler 525 is configured to receive the data signal from the data receiver 520, receive the eight clock phases from the sampling clock generator 410, sample the data symbols of the data signal using the eight clock phases, and convert the sampled data symbols into the corresponding bits. The data sampler 525 may output the bits to a digital signal processor (DSP) to process the bits in the digital domain and/or a deserializer to output the bits in parallel bit streams.

Figure 5B:
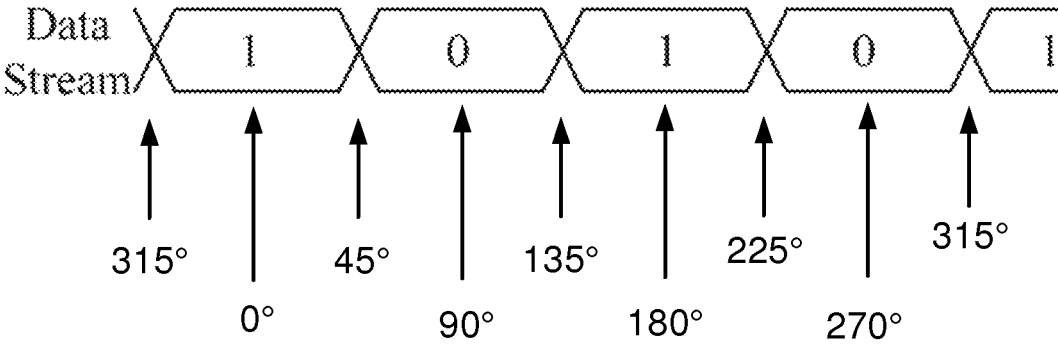
FIG. 5B is a timing diagram showing the timing of clock phases from the sampling clock generator with respect to a data signal according to certain aspects of the present disclosure.

As discussed above, the clock phases from the sampling clock generator 410 are aligned with the data signal using the phase interpolator 420 (shown in FIG. 4). In this regard, FIG. 5B is a timing diagram showing an example of the data signal (e.g., a serial data stream) and the timing of the clock phases with respect to the data signal, in which the clock phases are spaced 45 degrees apart. In FIG. 5B, the position of each of the clock phases corresponds to an edge (e.g., rising edge) of the corresponding clock signal. In this example, the system 505 may be a quarter rate system in which the clock signals corresponding to the clock phases may have a frequency equal to a quarter of the frequency of the data signal. However, it is to be appreciated that the present disclosure is not limited to this example.

In the example shown in FIG. 5B, four of the clock phases (i.e., 0°, 90°, 180°, and 270°) are centrally aligned between adjacent data transitions in the data signal, and fourth of the clock phases (i.e., 45°, 135°, 225°, and 315°) are aligned with data transitions in the data signal. The data sampler 525 may use the four clock phases between the data transitions for sampling the data signal (e.g., sampling the data symbols in the data signal) and may use at least one of the phases aligned with the data transitions for clock alignment.

In this example, the sampling clock generator 410 uses the multiphase generator 170, the multiphase injection circuit 150, and the injection locking oscillator 110 to generate the eight clock phases for the phase interpolator 420 based on the input clock signals Clk and Clkb, which may not be aligned with the data signal. The eight clock phases from the injection locking oscillator 110 allows the phase interpolator 420 to generate the phase-rotated clock signals Clk_r and Clkb_r based on the timing information from the CDR circuit 530 with high linearity. The sampling clock generator 410 then uses the second multiphase generator 430, the second multiphase injection circuit 440, and the injection locking oscillator 450 to generate the eight clock phases for the data sampler 525 based on the phase-rotated clock signals Clk_r and Clkb_r. The eight phases from the second injection locking oscillator 450 are aligned with the data signal being sampled due to the phase rotation by the phase interpolator 420.

However, the sampling clock generator 410 consumes a relatively large amount of power. This is because the sampling clock generator 410 requires power for powering two multiphase generators 170 and 430, two multiphase injection circuits 150 and 440, and two injection locking oscillators 110 and 450.

To address the above, aspects of the present disclosure embed phase interpolation capability into the injection circuits of a multiphase injection circuit. This eliminates the need for the standalone phase interpolator 420, the second multiphase generator 430, the second multiphase injection circuit 440, and the second injection locking oscillator 450 shown in FIG. 4, resulting in a significant reduction in power consumption and area savings, as discussed further below.

Figure 6A:
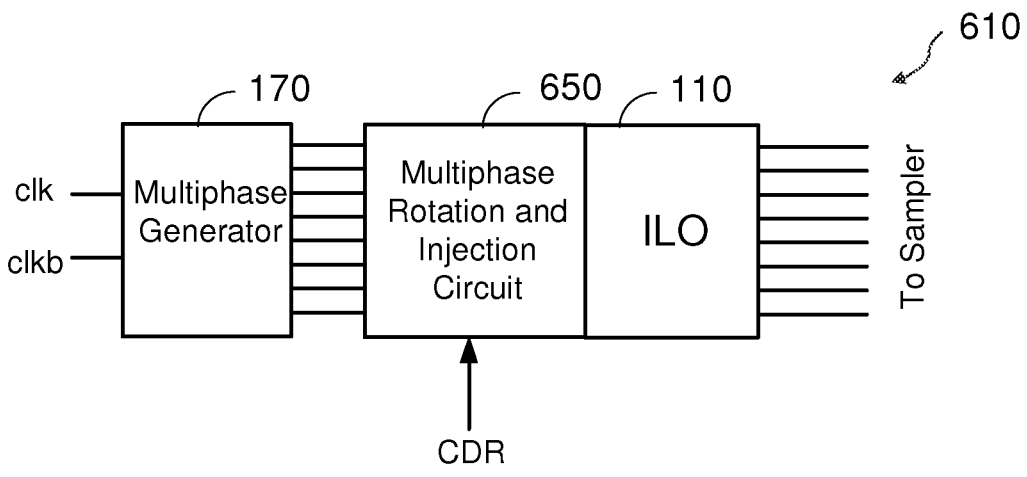
FIG. 6A shows an example of a sampling clock generator including a multiphase injection circuit with phase rotation capability according to certain aspects of the present disclosure.
Figure 6B:
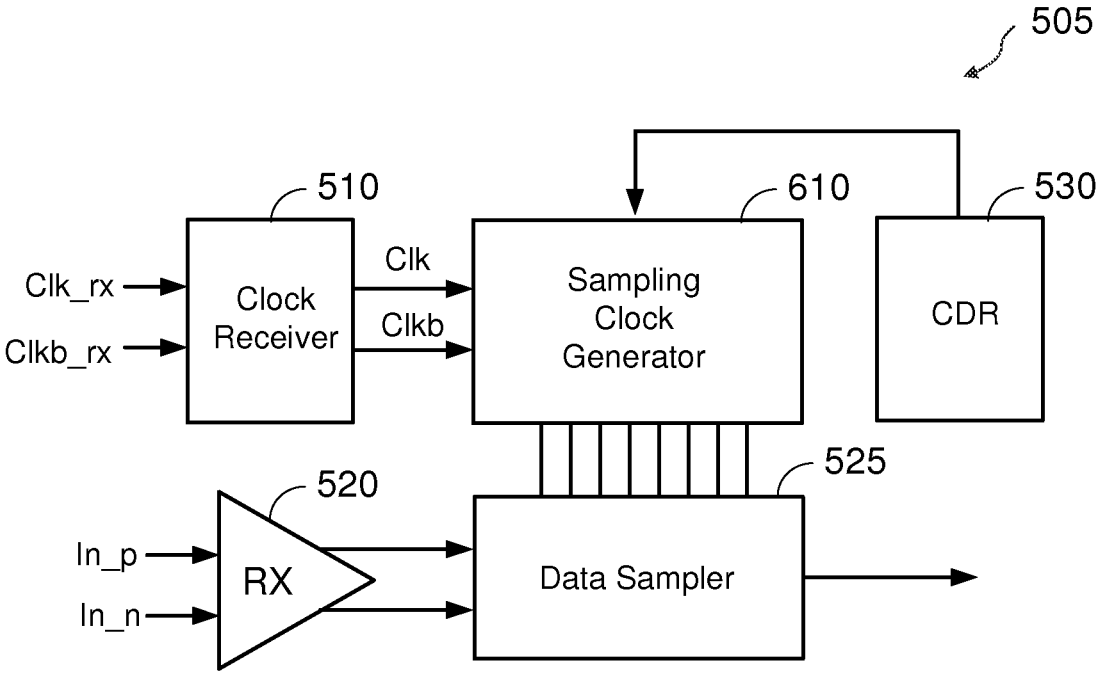
FIG. 6B shows an example of a system including the sampling clock generator of FIG. 6A according to certain aspects of the present disclosure.

FIG. 6A shows an example of a sampling clock generator 610 for generating the sampling clock signals for the data sampler 525 (shown in FIG. 6B). In this example, the sampling clock generator 610 includes the multiphase generator 170 and the injection locking oscillator 110 discussed above. The sampling clock generator 610 also includes a multiphase injection circuit 650 with phase rotation capability according to certain aspects.

The multiphase injection circuit 650 is configured to receive the clock phases from the multiphase generator 170, rotate the phases of the clock phases using phase interpolation to align the clock phases with the data signal based on timing information from the CDR circuit 530 (shown in FIG. 6B), and inject the resulting rotated clock phases into the injection locking oscillator 110. Since the rotated clock phases injected into the injection locking oscillator 110 are aligned with the data signal, the sampling clock phases output by the injection locking oscillator 110 are also aligned with the data signal. This eliminates the need for the standalone phase interpolator 420, the second multiphase generator 430, the second multiphase injection circuit 440, and the second injection locking oscillator 450 shown in

9

FIG. 4, resulting in a significant reduction in power consumption and area savings compared with the sampling clock generator 410. Exemplary implementations of the multiphase injection circuit 650 are discussed further below. In some implementations, a buffer circuit (an instance of the buffer circuit 180 in FIG. 1B) may be placed between the injection locking oscillator 110 and the data sampler 525 to drive the data sampler 525 with the clock phases.

FIG. 6B show an example in which the sampling clock generator 610 of FIG. 6A is included in the exemplary system 505. In this example, the sampling clock generator 610 receives the input clock signal Clk and Clkb from the clock receiver 510, and outputs the sampling clock phases to the data sampler 525.

Figure 7A:
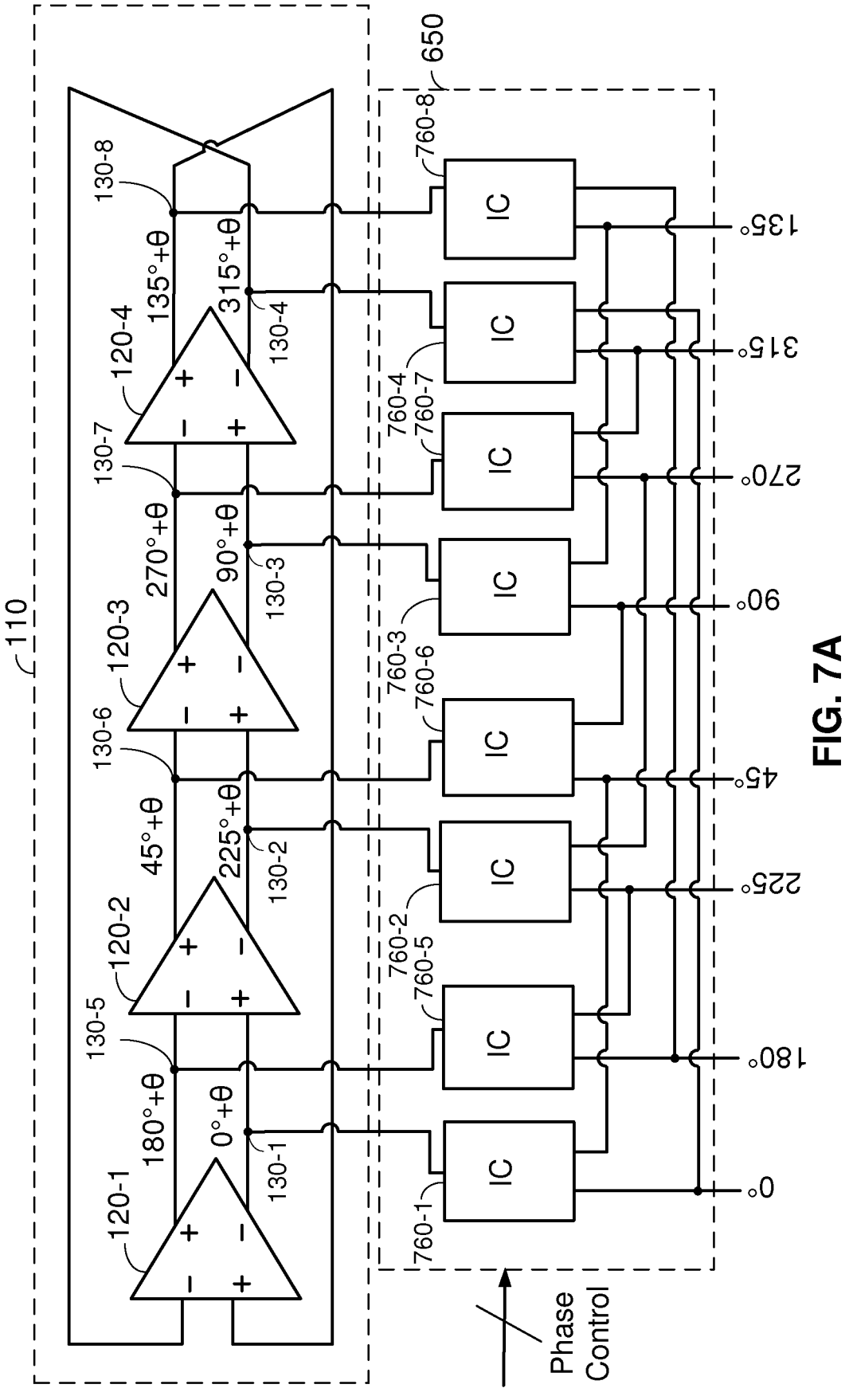
FIG. 7A shows an exemplary implementation of the multiphase injection circuit of FIG. 6A according to certain aspects of the present disclosure.

FIG. 7A shows an exemplary implementation of the multiphase injection circuit 650 according to certain aspects. In this example, the multiphase injection circuit 650 is capable of phase rotations over a rotation range of 45 degrees. As exemplary implementation capable of phase rotations over a rotation range of 360 degrees using multiplexers is discussed further below.

In this example, the multiphase injection circuit 650 includes injection circuits 760-1 to 760-8 where each of the injection circuits 760-1 to 760-8 is coupled to a respective one of the nodes 130-1 to 130-8 of the injection locking oscillator 110. In this example, each of the injection circuits 760-1 to 760-8 is also coupled to a respective pair of outputs 175-1 to 175-8 of the multiphase generator 170 (shown in FIG. 1A) to receive a respective pair of consecutive clock phases from the multiphase generator 170. Note that the multiphase generator 170 is not shown in FIG. 7A for case of illustration. In certain aspects, the consecutive clock phases received by each of the injection circuits 760-1 to 760-8 are phase offset from each other by 45 degrees. In this example, it is assumed that each of the injection circuits 760-1 to 760-8 is non-inverting for case of discussion. An example in which the injection circuits 760-1 to 760-8 are inverting is discussed below with reference to FIG. 7B.

In the example shown in FIG. 7A, the injection circuit 760-1 receives the clock phases 0° and 45° from the multiphase generator 170, the injection circuit 760-2 receives the clock phases 225° and 270° from the multiphase generator 170, the injection circuit 760-3 receives the clock phases 90° and 135° from the multiphase generator 170, and the injection circuit 760-4 receives the clock phases 315° and 0° from the multiphase generator 170. In addition, the injection circuit 760-5 receives the clock phases 180° and 225° from the multiphase generator 170, the injection circuit 760-6 receive the clock phases 45° and 90° from the multiphase generator 170, the injection circuit 760-7 receives the clock phases 270° and 315° from the multiphase generator 170, and the injection circuit 760-8 receives the clock phases 135° and 180° from the multiphase generator 170.

Each of the injection circuits 760-1 to 760-8 is configured to mix the respective pair of consecutive clock phases to generate a rotated clock phase having a phase that is between the phases of the consecutive clock phases, and inject the rotated clock phase into the respective one of the nodes 130-1 to 130-8 of the injection locking oscillator 110. Each of the injection circuits 760-1 to 760-8 is configured to control the phase rotation of the respective rotated clock phase by controlling the relative injection strengths of the respective pair of clock phases that are mixed to generate the respective rotated clock phase. In the example in FIG. 7A, the phase rotation θ of each of the injection circuits 760-1 to 760-8 is controlled by a phase control signal from the CDR circuit 530. However, it is to be appreciated that the present disclosure is not limited to this example.

In this example, the injection circuits 760-1 to 760-8 inject the rotated clock phases into the respective nodes 130-1 to 130-8 of the injection locking oscillator 110. This synchronizes the injection locking oscillator 110 with the injection frequency, causing the injection locking oscillator 110 to output the clock phases 0°+θ, 225°+θ, 90°+θ, 315°+θ, 180°+θ, 45°+θ, 270°+θ, and 135°+θ at the nodes 130-1, 130-2, 130-3, 130-4, 130-5, 130-6, 130-7, and 130-8, respectively, wherein θ is the phase rotation. Thus, the clock phases output by the injection locking oscillator 110 correspond to the clock phases from the multiphase generator 170 rotated by the phase θ. In certain aspects, the CDR circuit 530 controls the phase rotation θ to align the clock phases from the injection locking oscillator 110 with the data signal discussed above. In this example, the same phase control signal may be input to the injection circuits 760-1 to 760-8 since the phase rotation of θ is the same for the injection circuits 760-1 to 760-8. However, it is to be appreciated that the present disclosure is not limited to this example.

Figure 7B:
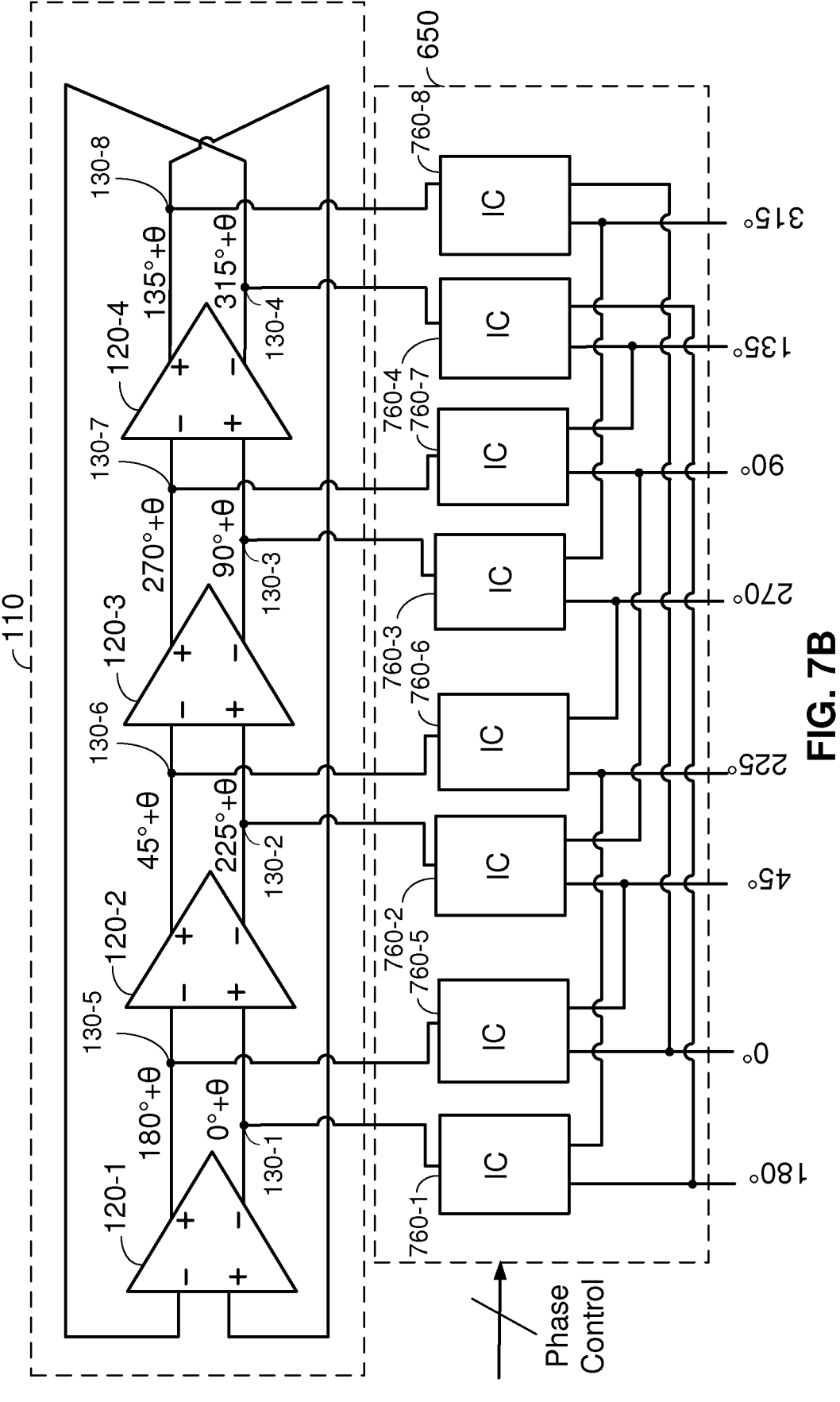
FIG. 7B shows another exemplary implementation of the multiphase injection circuit of FIG. 6A according to certain aspects of the present disclosure.

In the discussion above, the injection circuits 760-1 to 760-8 are assumed to be non-inverting. FIG. 7B shows an example in which the injection circuits 760-1 to 760-8 are inverting. In this example, the clock phases input to the injection circuits 760-1 to 760-8 may be shifted by 180 with respect clock phases shown in FIG. 7A to account for the inversions in the injection circuits 760-1 to 760-8 in this example. Thus, the injection circuits 760-1 to 760-8 may be inverting or non-inverting.

Figure 8A:
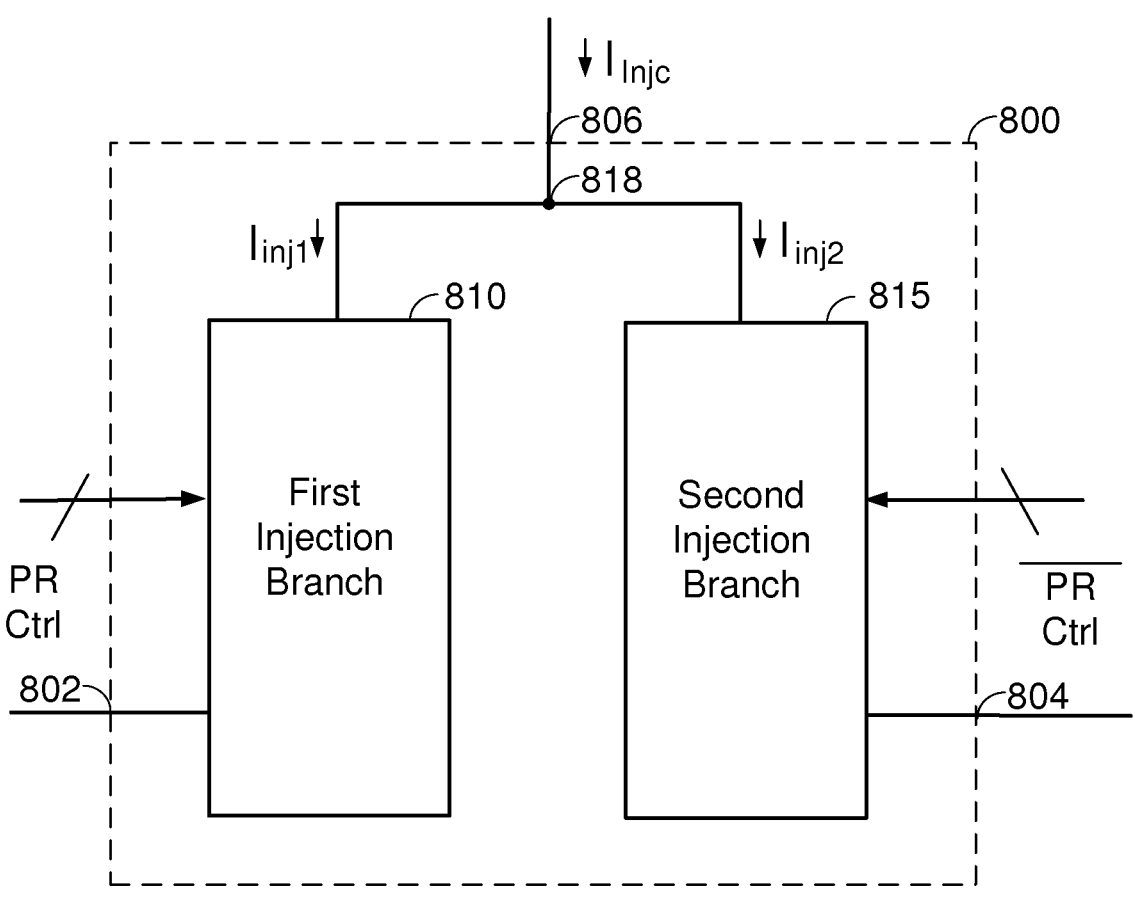
FIG. 8A shows an exemplary implementation of an injection circuit with phase interpolation according to certain aspects of the present disclosure.

FIG. 8A shows an exemplary implementation of an injection circuit 800 with phase interpolation according to certain aspects. The injection circuit 800 may be used to implement each of the injection circuits 760-1 to 760-8 shown in FIG. 7A or FIG. 7B (i.e., each of the injection circuits 760-1 to 760-8 may be a separate instance of the injection circuit 800).

The injection circuit 800 has a first input 802, a second input 804, and an output 806. The first input 802 is configured to receive a first clock signal and the second input 804 is configured to receive a second clock signal. The first clock signal and the second clock signal may correspond to a pair of consecutive clock phases from the multiphase generator 170. For the example where the injection circuit 800 implements the injection circuit 760-1 in FIG. 7A, the first clock signal may correspond to the clock phase 0° and the second clock signal may correspond to the clock phase 45°. For the example where the injection circuit 800 implements the injection circuit 760-1 in FIG. 7B, the first clock signal may correspond to the clock phase 180° and the second clock signal may correspond to the clock phase 225°.

In this example, the first clock signal and the second clock signal have the same frequency and are phase offset from each other by 45 degrees (i.e., the phase offset between consecutive clock phases in the examples shown in FIG. 7A and FIG. 7B). However, it is to be appreciated that the present disclosure is not limited to this example.

In this example, the output 806 is coupled to a respective one of the nodes 130-1 to 130-8 of the injection locking oscillator 110. For example, when the injection circuit 800 implements the injection circuit 760-1, the output 806 is coupled to the node 130-1.

In this example, the injection circuit 800 includes a first injection branch 810 and a second injection branch 815. The first injection branch 810 is coupled to the first input 802 of the injection circuit 800 to receive the first clock signal (e.g., clock phase 0° in FIG. 7A or clock phase 180° in FIG. 7B), and the second injection branch 815 is coupled to the second input 804 of the injection circuit 800 to receive the second clock signal (e.g., clock phase 45° in FIG. 7A or clock phase 225° in FIG. 7B). The first injection branch 810 and the second injection branch 815 are also coupled to node 818, which is coupled to the output 806.

In certain aspects, the first injection branch 810 is configured to generate a first injection current (labeled "$I_{inj1}$") based on the first clock signal (e.g., clock phase 0° in FIG. 7A or clock phase 180° in FIG. 7B). For example, the first injection branch 810 may be configured to generate the first injection current when the first clock signal is high. The second injection branch 815 is configured to generate a second injection current (labeled "$I_{inj2}$") based on the second clock signal (e.g., clock phase 45° in FIG. 7A or clock phase 225° in FIG. 7B). For example, the second injection branch 815 may be configured to generate the first injection current when the second clock signal is high. However, it is to be appreciated that the present disclosure is not limited to this example.

The first and second injection currents are combined at the node 818 into a combined current (labeled "$I_{injc}$"). The current combining at node 818 mixes the phases of the first injection current and the second injection current, generating a rotated clock phase having a phase that is between the phases of the first injection current and the second injection current. For the example where the injection circuit 800 implements the injection circuit 760-1, the combined injection current has a phase between 0° and 45°.

In this example, the phase rotation θ is controlled by controlling the relative strengths of the first and second injection currents. In this regard, the first injection branch 810 is configured to set the strength (e.g., current level) of the first injection current based on a first phase control signal PR Ctrl and the second injection branch 815 is configured to set the strength (e.g., current level) of the second injection current based on a second phase control signal $\overline{PRCtrl}$, which may be the complement of the first phase control signal PR Ctrl.

Figure 8B:
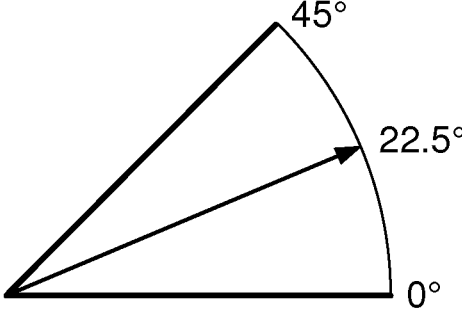
FIG. 8B shows an example of a phase rotation by the injection circuit of FIG. 8A according to certain aspects of the present disclosure.

The first and second phase control signals may come from the CDR circuit 530. In this example, the CDR circuit 530 may set the phase rotation θ of the injection circuit 800 by setting the strengths of the first and second injection currents accordingly using the phase control signals PR Ctrl and $\overline{PRCtrl}$. For example, the CDR circuit 530 may set the phase rotation θ to approximately 22.5° (i.e., center phase between 0° and 45°) by making the strengths of the first and second injection currents equal. In this regard, FIG. 8B shows an example of a phase rotation of 22.5°. The CDR circuit 530 may set the phase rotation θ to a phase rotation less than 22.5° by making the strength of the first injection current greater than the strength of the second injection current, and may set the phase rotation θ to a phase rotation greater than 22.5° by making the strength of the second injection current greater than the strength of the first injection current.

Figure 9A:
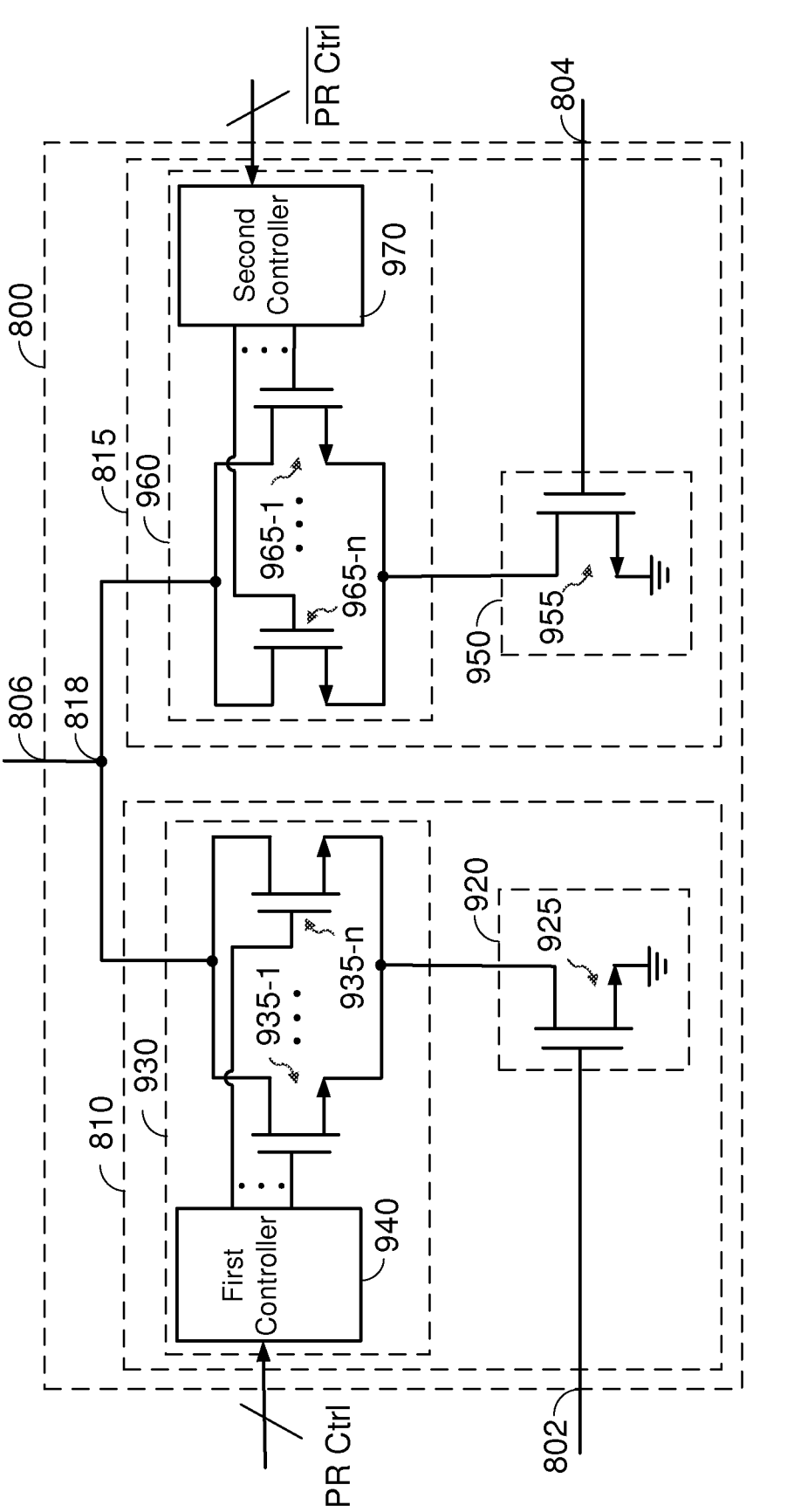
FIG. 9A shows an exemplary implementation of injection branches in the injection circuit of FIG. 8A according to certain aspects of the present disclosure.

FIG. 9A shows an exemplary implementation of the first injection branch 810 and the second injection branch 815 according to certain aspects of the present disclosure. In this example, the first injection branch 810 includes a first input circuit 920 and a first strength control circuit 930. The first input circuit 920 is coupled to the first input 802 to receive the first clock signal, and the first strength control circuit 930 is coupled between the first input circuit 920 and the node 818.

The first input circuit 920 is configured to generate the first injection current based on the first clock signal (e.g., clock phase 0° in FIG. 7A or clock phase 180° in FIG. 7B).

In the example in FIG. 9A, the first input circuit 820 includes a first input transistor 925 (e.g., a first NFET) having a gate coupled to the first input 802, a drain coupled to the first strength control circuit 930, and a source coupled to ground. In this example, the first input circuit 920 is configured to generate the first injection current when the first clock signal is high (assuming the voltage of the first clock signal in the high state is equal to or above the threshold voltage of the first input transistor 925). The first input transistor 925 may be physically implemented on the chip with one or more transistors (e.g., NFETs) coupled in parallel.

In this example, the first strength control circuit 930 is configured to control the strength (e.g., current level) of the first injection current based on the first phase control signal PR Ctrl. In the example in FIG. 9A, the first strength control circuit 930 includes first transistors 935-1 to 935-$n$ and a first controller 940. The first transistors 935-1 to 935-$n$ are coupled in parallel between the first input circuit 920 and the node 818. The first controller 940 is configured to control the strength of the first injection current by controlling the number of the first transistors 935-1 to 935-$n$ that are turned on based on the first phase control signal PR Ctrl. In this example, the first controller 940 may increase the strength of the first injection current by increasing the number of the first transistors 935-1 to 935-$n$ that are turned on, and decrease the strength of the first injection current by decreasing the number of the first transistors 935-1 to 935-$n$ that are turned on.

In this example, the first controller 940 is coupled to the gates of the first transistors 935-1 to 935-$n$. In this example, the first controller 940 may turn on one or more of the first transistors 935-1 to 935-$n$ by applying a bias voltage to the gate each of the one or more first transistors 935-1 to 935-$n$ (assuming the bias voltage is equal to or above the threshold voltage of the first transistors 935-1 to 935-$n$). The first controller 940 may turn off one or more of the first transistors 935-1 to 935-$n$ by coupling the gate of each of the one or more first transistors 935-1 to 935-$n$ to ground. However, it is to be appreciated that the present disclosure is not limited to this example.

In certain aspects, the first phase control signal PR Ctrl may include a first thermometer code including n control bits where n is an integer and each of the n control bits controls the on/off state of a respective one of the first transistors 935-1 to 935-$n$. In this example, the first controller 940 may be configured to turn on m of the first transistors 935-1 to 935-$n$ when m of the control bits have a first logic value (e.g., one) and n−m of the first transistors 935-1 to 935-$n$ have a second logic value (e.g., zero) where m is an integer between zero and n. However, it is to be appreciated that the present disclosure is not limited to this example.

In this example, the second injection branch 815 includes a second input circuit 950 and a second strength control circuit 960. The second input circuit 950 is coupled to the second input 804 to receive the second clock signal, and the second strength control circuit 960 is coupled between the second input circuit 950 and the node 818.

The second input circuit 950 is configured to generate the second injection current based on the second clock signal (e.g., clock phase 45° in FIG. 7A or clock phase 225° in FIG. 7B). In the example in FIG. 9A, the second input circuit 950 includes a second input transistor (e.g., a second NFET) having a gate coupled to the second input 804, a drain coupled to the second strength control circuit 960, and a source coupled to ground. In this example, the second input circuit 950 is configured to generate the second injection current when the second clock signal is high (assuming the voltage of the second clock signal in the high state is equal to or above the threshold voltage of the second input transistor 955). The second input transistor 955 may be physically implemented on the chip with multiple transistors (e.g., NFETs) coupled in parallel.

In this example, the second strength control circuit 960 is configured to control the strength (e.g., current level) of the second injection current based on the second phase control signal $\overline{PRCtrl}$, which may be the complement of the first phase control signal PR Ctrl. In the example in FIG. 9A, the second strength control circuit 960 includes second transistors 965-1 to 965-$n$ and a second controller 970. The second transistors 965-1 to 965-$n$ are coupled in parallel between the second input circuit 950 and the node 818. The second controller 970 is configured to control the strength of the second injection current by controlling the number of the second transistors 965-1 to 965-$n$ that are turned on based on the second phase control signal $\overline{PRCtrl}$. In this example, the second controller 970 may increase the strength of the second injection current by increasing the number of the second transistors 965-1 to 965-$n$ that are turned on, and decrease the strength of the second injection current by decreasing the number of the second transistors 965-1 to 965-$n$ that are turned on.

In this example, the second controller 970 is coupled to the gates of the second transistors 965-1 to 965-$n$. In this example, the second controller 970 may turn on one or more of the second transistors 965-1 to 965-$n$ by applying a bias voltage to the gate each of the one or more second transistors 965-1 to 965-$n$ (assuming the bias voltage is equal to or above the threshold voltage of the second transistors 965-1 to 965-$n$). The second controller 970 may turn off one or more of the second transistors 965-1 to 965-$n$ by coupling the gate of each of the one or more second transistors 965-1 to 965-$n$ to ground. However, it is to be appreciated that the present disclosure is not limited to this example.

In certain aspects, the second phase control signal $\overline{PRCtrl}$ may include a second thermometer code including n control bits where each of the n control bits controls the on/off state of a respective one of the second transistors 965-1 to 965-$n$. In this example, the first controller 940 may be configured to turn on k of the second transistors 965-1 to 965-$n$ when k of the control bits have the first logic value (e.g., one) and n–k of the second transistors 965-1 to 965-$n$ have the second logic value (e.g., zero) where k is an integer is between zero and n. However, it is to be appreciated that the present disclosure is not limited to this example.

Thus, in this example, the first controller 940 turns on m of the first transistors 935-1 to 935-$n$ based on the first phase control signal PR Ctrl and the second controller 970 turns on k of the second transistors 965-1 and 965-$n$ based on the second phase control signal $\overline{PRCtrl}$. Each of the controllers 940 and 970 may be implemented with switches, combinational logic, or a combination thereof. When m and k are equal, the injection strengths of the first injection branch 810 and the second injection branch 815 are approximately equal, resulting in a phase rotation $\theta$ of approximately 22.5° when the pair of clock signals input to the injection circuit 800 are spaced 45° apart from each other.

In certain aspects, the combined injection strength of the first injection branch 810 and the second injection branch 815 is constant across phase rotations. Thus, when the strength of the first injection branch 810 is increased to decrease the phase rotation $\theta$, the strength of the second injection branch 815 is decreased by an equal amount to keep the combined injection strength constant. Similarly, when the strength of the second injection branch is increased to increase the phase rotation $\theta$, the strength of the first injection branch is decreased by an equal amount to keep the combined injection strength constant. Thus, in this example, the injection strength of the injection circuit 800 (i.e., the combined injection strength of the first injection branch 810 and the second injection branch 815) is constant across phase rotations. The constant injection strength of the injection circuit 800 across phase rotations may significantly reduce the impact of the phase rotations on the jitter performance and locking range of the injection locking oscillator 110. If the injection strength varied with phase rotation, then the locking range and jitter performance would also vary with phase rotation. This is avoided by keeping the injection strength approximately constant.

In certain aspects, the constant injection strength across phase rotations may be accomplished by making the first phase control signal PR Ctrl and the second phase control signal $\overline{PRCtrl}$ complementary thermometer codes. This causes the total number of the first transistors 935-1 to 935-$n$ and the second transistors 965-1 and 965-$n$ that are turned on (i.e., m+k) to be constant (i.e., n) across phase rotations. Thus, when the number m of the first transistors 935-1 to 935-$n$ that are turned on is increased by j to decrease the phase rotation, the number k of the second transistors 965-1 to 965-$n$ that are turned on is decreased by j where j is an integer. Similarly, when the number k of the second transistors 965-1 to 965-$n$ that are turned on is increased by j to increase the phase rotation, the number m of the first transistors 935-1 to 935-$n$ that are turned on is decreased by j. As a result, m+k is constant when the phase rotation is adjusted in either direction.

In the above example, the phase rotation of each injection circuits 160-1 to 160-8 may be adjusted over a rotation range of 45 degrees by adjusting the relative injection strengths of the first injection branch 810 and the second injection branch 815 of each of the injection circuits 160-1 to 160-8.

It is to be appreciated that the strength control circuits 930 and 960 are not limited to the exemplary implementation shown in FIG. 9A. In this regard, FIG. 9B shows another exemplary implementation of the first strength control circuit 930 and the second strength control circuit 960 according to certain aspects of the present disclosure.

In this example, the first strength control circuit 930 includes a first transistor 982 coupled between the first input circuit 920 and the node 818. The first controller 940 includes a first digital-to-analog converter (DAC) 984 coupled to the gate of the first transistor 982. In this example, the first DAC 984 is configured to receive the first phase control signal PR Ctrl, convert the first phase control signal PR Ctrl into a first gate bias voltage Vb1, and output the first gate bias voltage Vb1 to the gate of the first transistor 982. In this example, the first DAC 984 controls the strength of the first injection current by controlling the first gate bias voltage Vb1 based on the PR Ctrl.

Figure 9B:
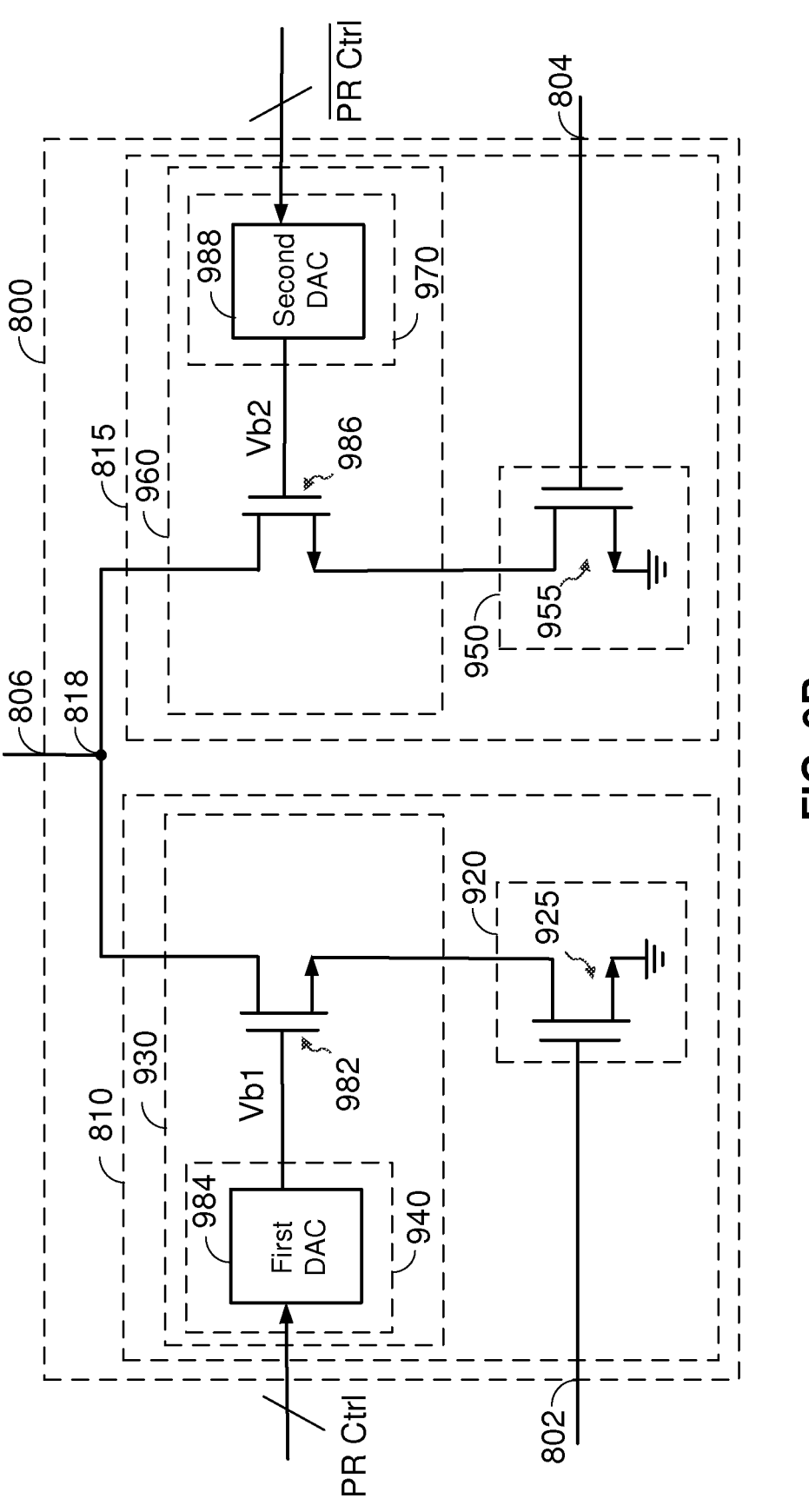
FIG. 9B shows another exemplary implementation of injection branches in the injection circuit of FIG. 8A according to certain aspects of the present disclosure.

In the example shown in FIG. 9B, the first transistor 982 is implemented with a NFET. In this example, the first DAC 984 may increase the first gate voltage Vb1 to increase the strength of the first injection current and decrease the first gate voltage Vb1 to decrease the strength of the first injection current. In other implementations, the first transistor 982 may be implemented with a PFET.

In this example, the second strength control circuit 960 includes a second transistor 986 coupled between the second input circuit 950 and the node 818. The second controller 970 includes a second DAC 988 coupled to the gate of the second transistor 986. In this example, the second DAC 988 is configured to receive the second phase control signal PRCtrl, convert the second phase control signal $\overline{PRCtrl}$ into a second gate bias voltage Vb2, and output the second gate bias voltage Vb2 to the gate of the second transistor 986. In this example, the second DAC 988 controls the strength of the second injection current by controlling the second gate bias voltage Vb2 based on the signal $\overline{PRCtrl}$.

In the example shown in FIG. 9B, the second transistor 986 is implemented with a NFET. In this example, the second DAC 988 may increase the second gate voltage Vb2 to increase the strength of the second injection current and decrease the second gate voltage Vb2 to decrease the strength of the second injection current. In other implementations, the second transistor 986 may be implemented with a PFET.

In certain aspects, a rotation range of 360 degrees may be achieved with the addition of multiplexers in the multiphase injection circuit 650. In this regard, FIG. 10 shows an example in which the multiphase injection circuit 650 includes multiplexers 1010-1 to 1010-8 for achieving a rotation range of 360 degrees for each of the injection circuits 160-1 to 160-8.

Figure 10:
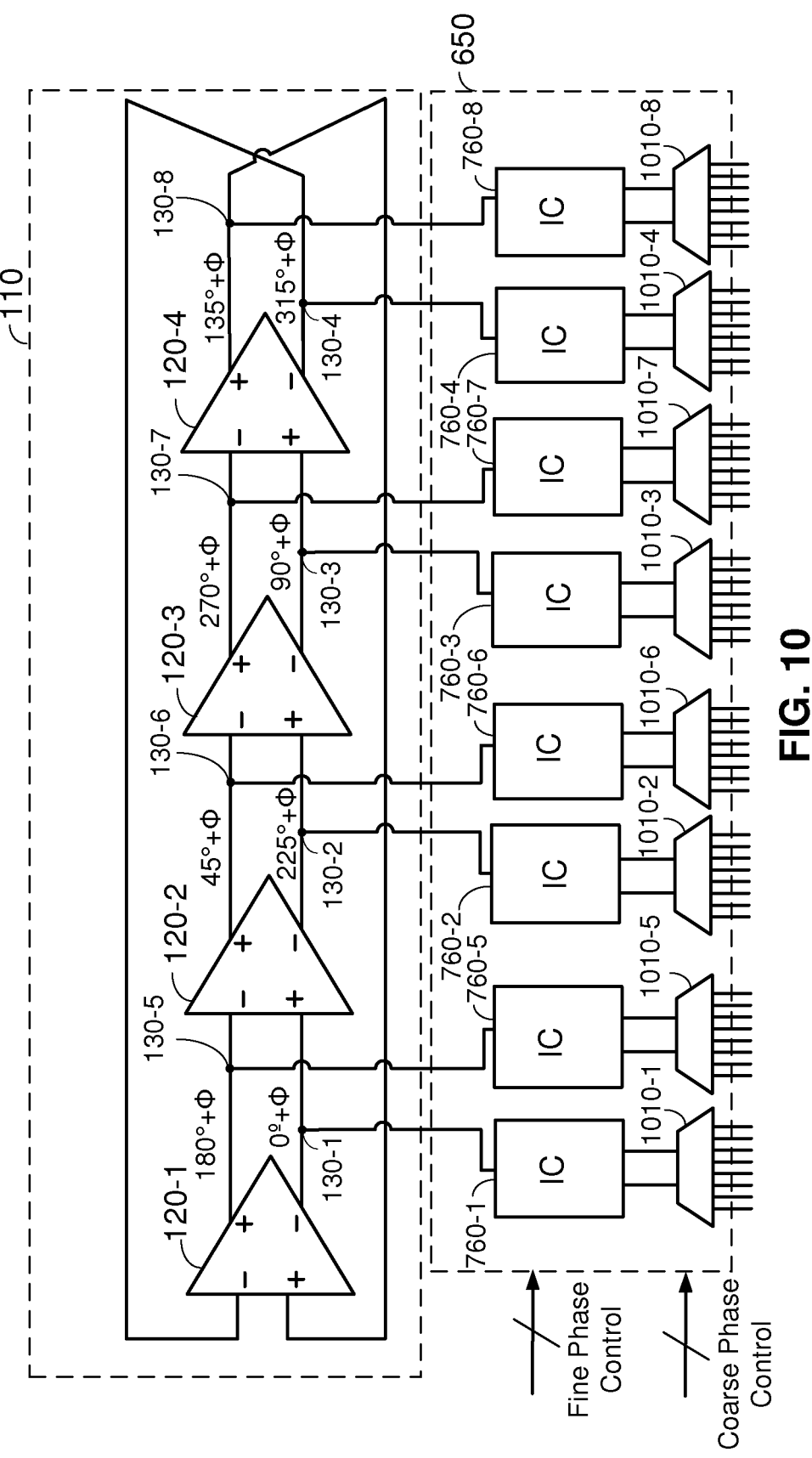
FIG. 10 shows an example in which the multiphase injection circuit includes multiplexers according to certain aspects of the present disclosure.

In the example in FIG. 10, each of the multiplexers 1010-1 to 1010-8 has a first output and a second output coupled to a respective one of the injection circuits 760-1 to 760-8, and eight inputs coupled to the outputs 175-1 to 175-8 of the multiphase generator 170 (shown in FIG. 1A) to receive all eight clock phases 0°, 45°, 90°, 135°, 180°, 225°, 270°, and 315°. In this example, each of the multiplexers 1010-1 to 1010-8 is configured to select a respective pair of consecutive clock phases from the multiphase generator 170 based on a coarse phase control signal, and input the selected pair of consecutive clock phases to the respective injection circuit 160-1 to 160-8. This allows the phase rotation of each of the injection circuits 160-1 to 160-8 to be adjusted in coarse steps of 45 degrees (i.e., 45°) by controlling the pair of consecutive clock phases that are selected by the respective one of the multiplexers 1010-1 to 1010-8 using the coarse phase control signal (i.e., controlling the pair of consecutive clock signals that are routed to the injection circuit by the respective one of the multiplexers 1010-1 to 1010-8).

In this example, the multiplexers 1010-1 to 1010-8 may be configured to select different pairs of consecutive clock phases based on the coarse phase control signal in order to maintain a phase offset of 45 degrees between the clock phases at the nodes 130-1 to 130-8. For example, when the multiplexer 1010-1 selects clock phases 0° and 45°, the multiplexer 1010-2 selects clock phases 225° and 270°, the multiplexer 1010-3 selects clock phases 90° and 135°, and so forth to maintain a 45 degree separation between the clock phases. In another example, when the multiplexer 1010-1 selects clock phases 45° and 90°, the multiplexer 1010-2 selects clock phases 270° and 315°, the multiplexer 1010-3 selects clock phases 135° and 180°, and so forth to maintain a 45 degree separation between the clock phases.

In the example shown in FIG. 10, the phase rotation is given by @ which includes the coarse phase rotation by the multiplexers 1010-1 to 1010-8 and the phase rotation θ by the first and second injection branches 810 and 815 in each of the injection circuits 160-1 to 160-8. As shown in the example in FIG. 10, the phases at the nodes 130-1 to 130-8 are phase offset by 45 degrees from one another. In this example, the coarse phase rotation is adjusted in steps of 45 degrees (i.e., 45°). The phase rotation θ provided by the first and second injection branches 810 and 815 in each of the injection circuits 160-1 to 160-8 may be adjusted in steps of 45°/n.

Figure 11:
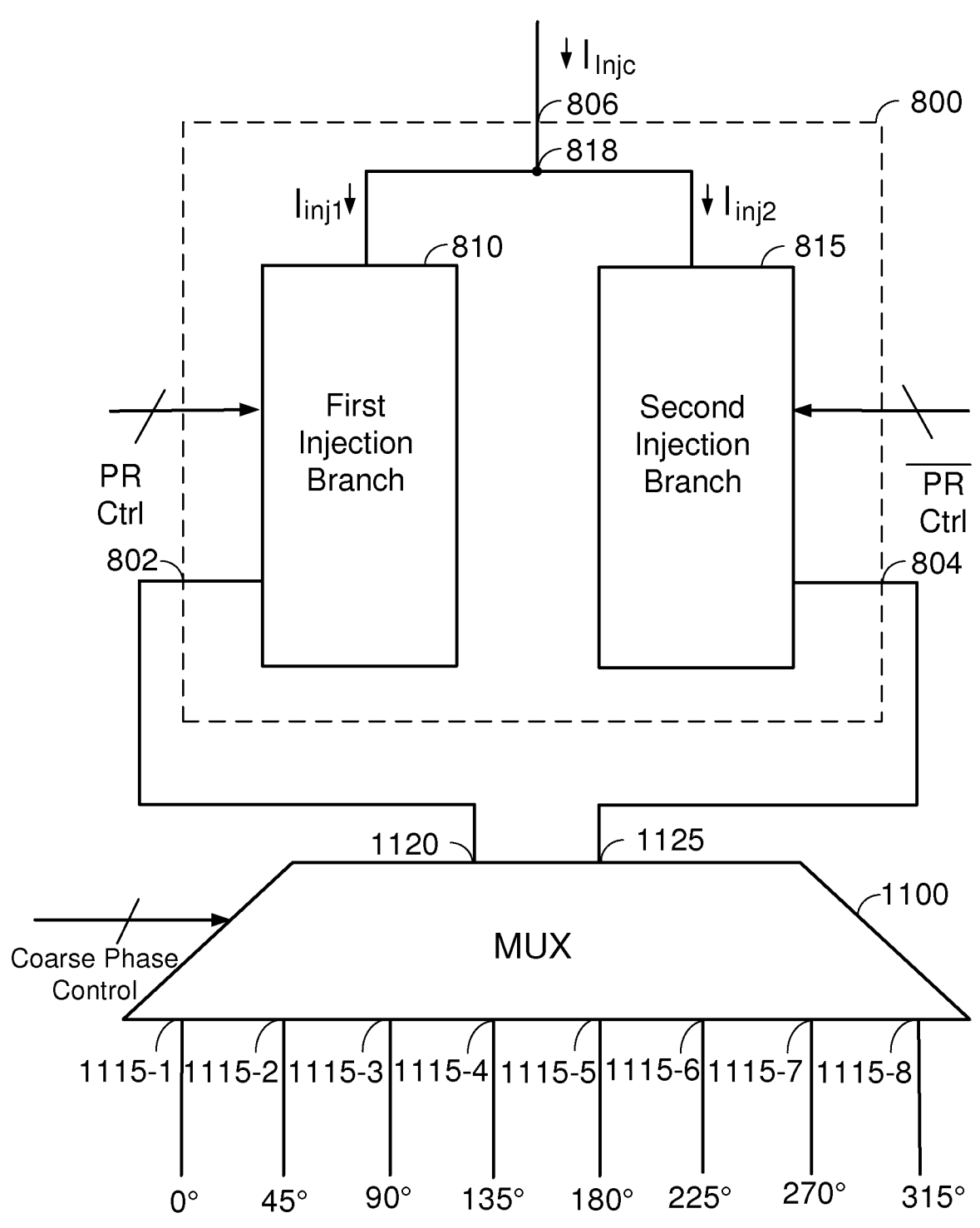
FIG. 11 shows an example of a multiplexer coupled to the exemplary injection circuit of FIG. 8A according to certain aspects of the present disclosure.

FIG. 11 shows an example of a multiplexer 1100 coupled to the exemplary injection circuit 800 of FIG. 8A discussed above. The injection circuit 800 may be used to implement each of the injection circuits 760-1 to 760-8 shown in FIG. 10, and the multiplexer 1100 may be used to implement the respective one of the multiplexers 1010-1 to 1010-8 shown in FIG. 10.

In this example, the multiplexer 1100 has a first output 1120 coupled to the first input 802 of the injection circuit 800 and a second output 1125 coupled to the second input 804 of the injection circuit 800. The multiplexer 1110 also has inputs 1115-1 to 1115-8 to receive the clock phases 0°, 45°, 90°, 135°, 180°, 225°, 270°, and 315° from the multiphase generator 170. In this regard, each of the inputs 1115-1 to 1115-8 may be coupled to a respective one of the outputs 175-1 to 175-8 of the multiphase generator 170 (shown in FIG. 1A).

In this example, the multiplexer 1100 is configured to select a pair of consecutive clock phases from the inputs 1115-1 to 1115-8 based on the coarse phase control signal, output one of the selected clock phases to the first input 802 of the injection circuit 800 via the first output 1120, and output the other one of the selected clock phases to the second input 804 of the injection circuit 800 via the second output 1125. This allows the phase rotation to be adjusted in coarse steps of 45 degrees (i.e., 45°) by controlling the pair of consecutive clock phases that are selected by the multiplexer 1100.

Figure 12:
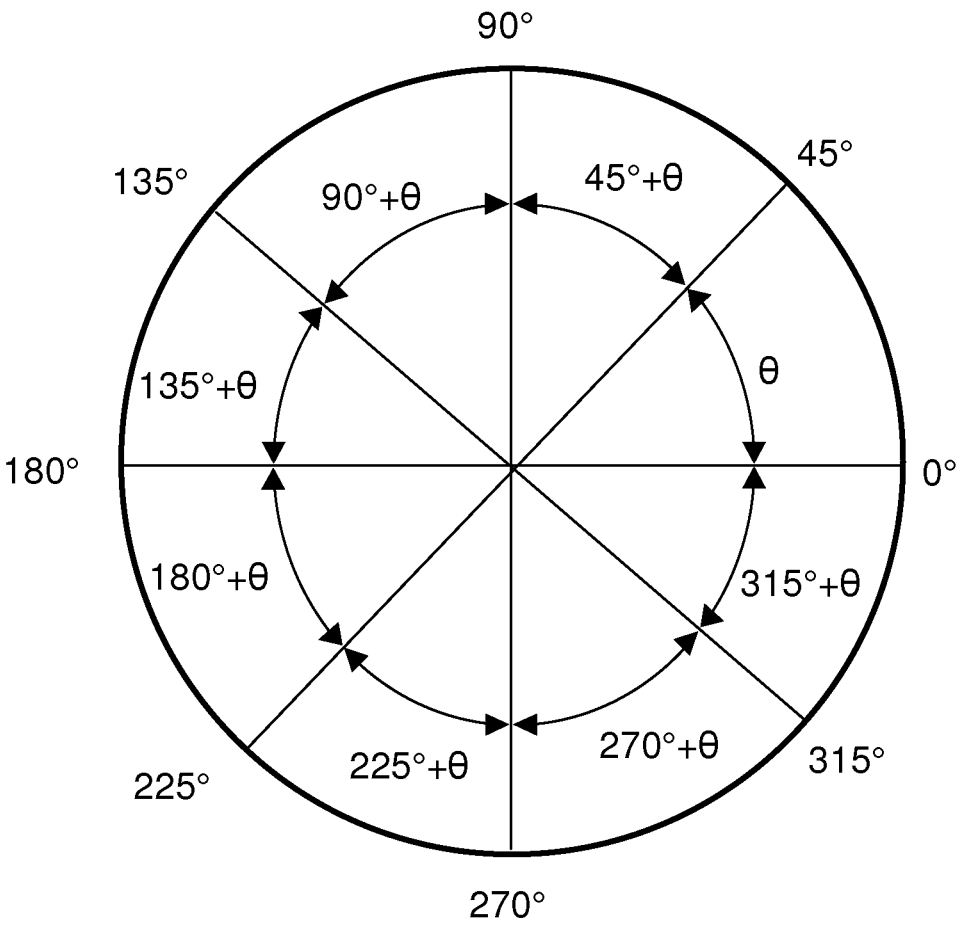
FIG. 12 shows an example of phase rotation for the exemplary injection circuit and multiplexer of FIG. 11 according to certain aspects of the present disclosure.

FIG. 12 shows the range of phase rotation that can be achieved using the multiplexer 1100. As shown in the example in FIG. 12, when the multiplexer 1100 selects the clock phases 0° and 45°, the phase rotation is θ where θ is the phase rotation provided by the injection branches 810 and 815 based on the phase control signals PR Ctrl and $\overline{PRCtrl}$. When the multiplexer 1100 selects the clock phases 45° and 90°, the phase rotation is 45°+θ. When the multiplexer 1100 select the clock phases 90° and 135°, the phase rotation is 90°+θ. When the multiplexer 1100 selects the clock phases 135° and 180°, the phase rotation is 135°+θ, and so forth. Thus, as shown in FIG. 12, a 360° range of phase rotation is possible using the multiplexer 1100.

The multiplexer 1110 may be implemented with switches, logic gates, or any combination thereof. In some implementations, the multiplexer 1100 may include two or more multiplexers.

Figure 13:
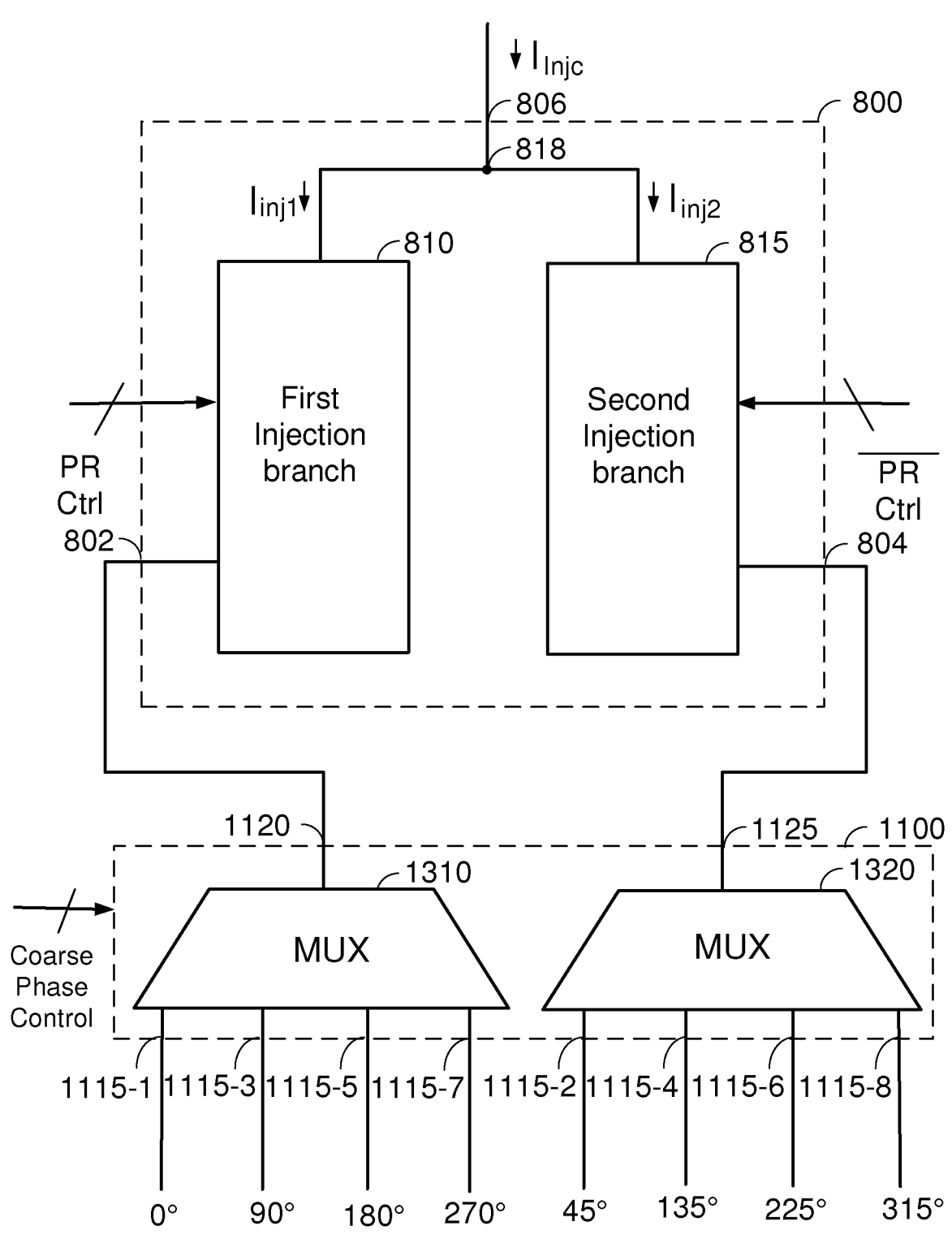
FIG. 13 shows an example in which the multiplexer of FIG. 11 includes a first multiplexer and a second multiplexer according to certain aspects of the present disclosure.

For example, FIG. 13 shows an example where the multiplexer 1100 includes a first multiplexer 1310 coupled to the first input 802 of the injection circuit 800 and a second multiplexer 1320 coupled to the second input 804 of the injection circuit 800. In this example, the first multiplexer 1310 is coupled to the inputs 1115-1, 1115-3, 1115-5, and 1115-7 to receive the clock phases 0°, 90°, 180°, and 270°, and the second multiplexer 1320 is coupled to the inputs 1115-2, 1115-4, 1115-6, and 1115-8 to receive the clock phases 45°, 135°, 225°, and 315°.

In operation, the first multiplexer 1310 is configured to select one of the clock phases 0°, 90°, 180°, and 270° based on the coarse phase control signal, and output the selected one of the clock phases 0°, 90°, 180°, and 270° to the first input 802 of the injection circuit 800. The second multiplexer 1320 is configured to select one of the clock phases 45°, 135°, 225°, and 315° based on the coarse phase control signal, and output the selected one of the clock phases 45°, 135°, 225°, and 315° to the second input 804 of the injection circuit 800. In certain aspects, the coarse phase control signal may include multiple bits in which a first subset of the bits controls the selection of the first multiplexer 1310 and a second subset of the bits controls the selection of the second multiplexer 1320.

It is to be appreciated that the present disclosure is not limited to the exemplary implementations discussed above. For example, in some implementations, the injection locking oscillator 110 may be used in a half rate system. In this example, the injection locking oscillator 110 may include two stages in which the phase offset between the outputs of the injection locking oscillator 110 is 90 degrees instead of 45 degrees. In this example, the multiphase generator 170 may output the clock phases 0°, 90°, 180°, and 270°. Thus, in this example, the phase offset between two consecutive clock phases is 90 degrees instead of 45 degrees. As a result, the rotation range for the injection branches 810 and 815 in each of the injection circuits may be 90 degrees in this example. Therefore, it is to be appreciated that the present disclosure is not limited to a particular phase offset between consecutive clock phases.

It is also to be appreciated that the present disclosure is not limited to multiple clock phase injection. For example, in some implementations, a single clock phase may be injected into the injection locking oscillator 110. In this example, one of the injection circuits 760-1 to 760-8 may be coupled to one of the nodes 130-1 to 130-8 of the injection locking oscillator 110. In general, one or more injection circuits 760-1 to 760-8 may be coupled to the injection locking oscillator 110 for injection of one or more clock phases.

It is also to be appreciated that the present disclosure is not limited to data samplers for high-speed communication, and that aspects of the present disclosure may be used in other applications requiring clock signals for timing.

Figure 14:
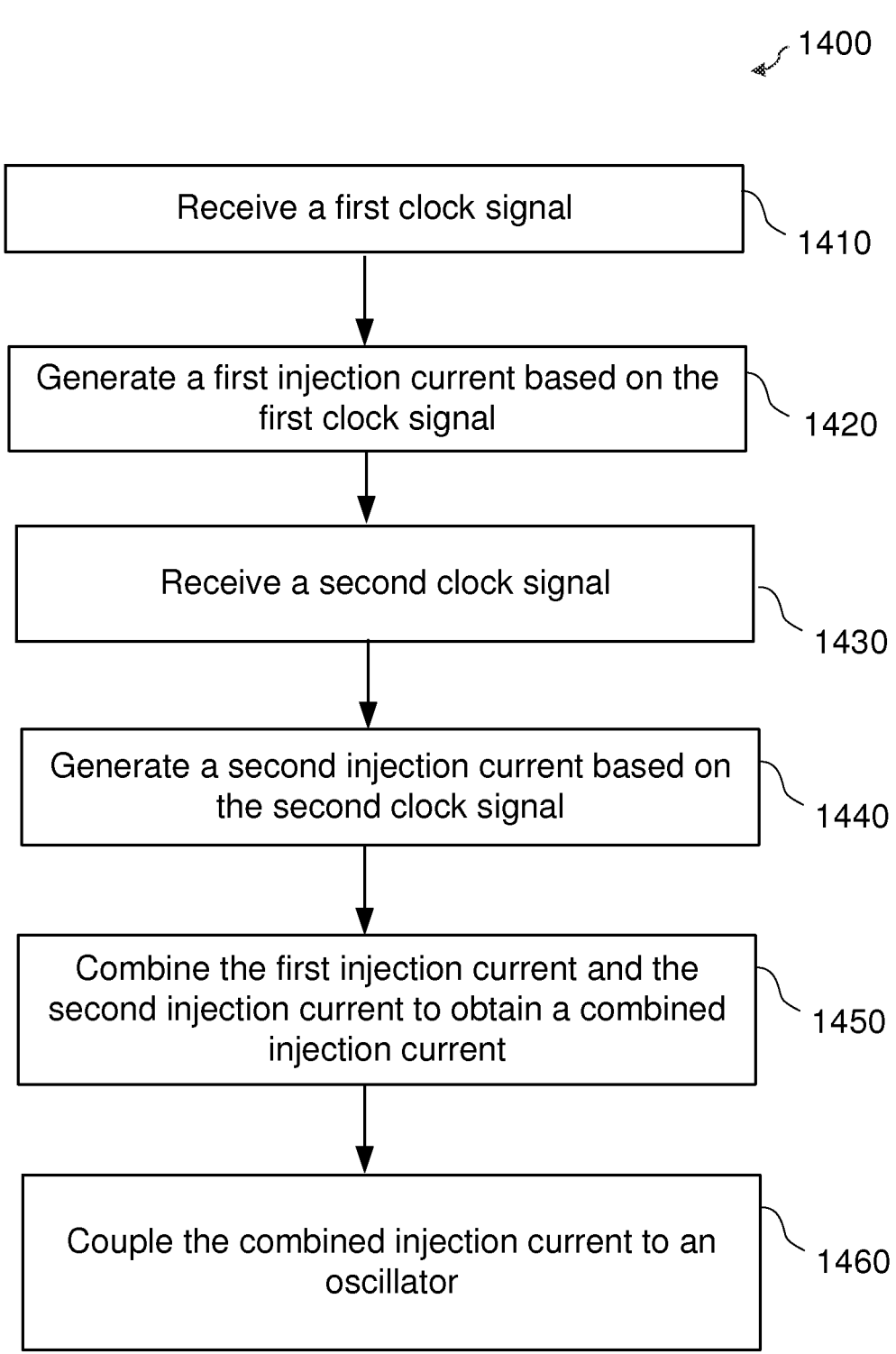
FIG. 14 is a flowchart illustrating a method of injection locking according to certain aspects of the present disclosure.

FIG. 14 shows a method 1400 for injection locking according to certain aspects of the present disclosure.

At block 1410, a first clock signal is received. For example, the first clock signal may be received by one of the injection circuits 760-1 to 760-8.

At block 1420, a first injection current is generated based on the first clock signal. For example, the first injection current may be generated by the first input circuit 920.

At block 1430, a second clock signal is received. For example, the second clock signal may be received by one of the injection circuits 760-1 to 760-8. In certain aspects, he first clock signal and the second clock signal are phase offset from one another. For example, the first clock signal and the second clock signal may be phase offset from one another by 45 degrees.

At block 1440, a second injection current is generated based on the second clock signal. For example, the second injection current may be generated by the second input circuit 950.

At block 1450, the first injection current and the second injection current are combined to obtain a combined injection current. For example, the first injection current and the second injection current may be combined at the node 818.

At block 1460, the combined injection current is coupled to an oscillator. The oscillator may correspond to the oscillator 110.

The method 1400 may also include setting a strength of the first injection current based on a first control code, and setting a strength of the second injection current based on a second control code, wherein the first control code and the second control code are complementary. For example, the strength of the first injection current may be set by the first strength control circuit 930 and the strength of the second injection current may be set by the second strength control circuit 960.

In certain aspects, the method 1400 may also include receiving multiple clock signals, and selecting the first clock signal and the second clock signal from among the multiple clock signals. For example, the first clock signal and the second clock signal may be selected by the multiplexer 1100. In certain aspects, the multiple clock signals are phase offset from one another. For example, the multiple clock signals may be phase offset from one another by 45 degrees.

It is to be appreciated that the exemplary blocks in FIG. 14 may be performed in any order and that some or all of the blocks may be performed concurrently in some implementations.

Implementation examples are described in the following numbered clauses:

1. A system, comprising:
    an oscillator;
    an injection circuit coupled to the oscillator, wherein the injection circuit comprises:
    a first injection branch coupled to a node, wherein the first injection branch is configured to receive a first clock signal and generate a first injection current based on the first clock signal;
    a second injection branch coupled to the node, wherein the second injection branch is configured to receive a second clock signal and generate a second injection current based on the second clock signal, and wherein the first injection current and the second injection current are combined at the node.

2. The system of clause 1, wherein the first clock signal and the second clock signal are phase offset from one another.

3. The system of clause 2, wherein the first clock signal and the second clock signal are phase offset from one another by 45 degrees.

4. The system of any one of clauses 1 to 3, wherein:
    the first injection branch is configured to set a strength of the first injection current based on a first control code; and
    the second injection branch is configured to set a strength of the second injection current based on a second control code, wherein the first control code and the second control code are complementary.

5. The system of any one of clauses 1 to 4, further comprising a multiplexer configured to receive multiple clock signals, select the first clock signal and the second clock signal from among the multiple clock signals, output the first clock signal to the first injection branch, and output the second clock signal to the second injection branch.

6. The system of clause 5, wherein the multiple clock signals are phase offset from one another.

7. The system of clause 6, wherein the multiple clock signals are phase offset from one another by 45 degrees.

8. The system of any one of clauses 5 to 7, further comprising a multiphase generator configured to receive one or more input clock signals, generate the multiple clock signals based on the one or more input clock signals, and output the multiple clock signals to the multiplexer.

9. The system of clause 8, wherein the one or more input clock signals comprise complementary clock signals.

10. The system of any one of clauses 1 to 9, wherein the first injection branch comprises:
    a first input transistor, wherein a gate of the first input transistor is configured to receive the first clock signal; and a first strength control circuit coupled between the node and a drain of the first input transistor, wherein the first strength control circuit is configured to control a strength of the first injection current based on a first control code.

11. The system of clause 10, wherein the second injection branch comprises:

a second input transistor, wherein a gate of the second input transistor is configured to receive the second clock signal; and a second strength control circuit coupled between the node and a drain of the second input transistor, wherein the second strength control circuit is configured to control a strength of the second injection current based on a second control code.

12. The system of clause 11, wherein the first control code and the second control code are complementary.

13. The system of clause 11 or 12, wherein the first strength control circuit comprises:

first transistors coupled in parallel between the node and the drain of the first input transistor; and a first controller configured to control a number of the first transistors that are turned on based on the first control code.

14. The system of clause 13, wherein the second injection branch comprises:

second transistors coupled in parallel between the node and the drain of the second input transistor; and a second controller configured to control a number of the second transistors that are turned on based on the second control code.

15. The system of clause 14, wherein the first control code and the second control code are complementary.

16. The system of any one of clauses 11 to 15, wherein a source of the first input transistor is coupled to a ground, and a source of the second input transistor is coupled to the ground.

17. The system of clause 16, wherein the first input transistor comprises a first n-type field effect transistor (NFET) and the second input transistor comprises a second NFET.

18. A method for injection locking, comprising:

receiving a first clock signal;

generating a first injection current based on the first clock signal;

receiving a second clock signal;

generating a second injection current based on the second clock signal;

combining the first injection current and the second injection current to obtain a combined injection current; and coupling the combined injection current to an oscillator.

19. The method of clause 18, wherein the first clock signal and the second clock signal are phase offset from one another.

20. The method of clause 19, wherein the first clock signal and the second clock signal are phase offset from one another by 45 degrees.

21. The method of any one of clauses 18 to 20, further comprising:

setting a strength of the first injection current based on a first control code; and setting a strength of the second injection current based on a second control code, wherein the first control code and the second control code are complementary.

22. The method of any one of clauses 18 to 21, further comprising:

receiving multiple clock signals; and selecting the first clock signal and the second clock signal from among the multiple clock signals.

23. The method of clause 22, wherein the multiple clock signals are phase offset from one another.

24. The method of clause 23, wherein the multiple clock signals are phase offset from one another by 45 degrees.

25. An apparatus for injection locking, comprising:

means for receiving a first clock signal;

means for generating a first injection current based on the first clock signal;

means for receiving a second clock signal;

means for generating a second injection current based on the second clock signal;

means for combining the first injection current and the second injection current to obtain a combined injection current; and means for coupling the combined injection current to an oscillator.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities. As used herein, "approximately" means within 90 percent to 110 percent of the stated value.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:

an oscillator; and an injection circuit coupled to the oscillator, wherein the injection circuit comprises:

a first injection branch coupled to a node, wherein the first injection branch comprises:

a first input circuit configured to receive a first clock signal and generate a first injection current based on the first clock signal; and a first strength control circuit coupled between the node and the first input circuit, wherein the first strength control circuit is configured to set a strength of the first injection current based on a first control code; and a second injection branch coupled to the node, wherein the second injection branch comprises:

a second input circuit configured to receive a second clock signal and generate a second injection current based on the second clock signal, wherein the first clock signal and the second clock signal are phase offset from one another by 45 degrees; and a second strength control circuit coupled between the node and the second input circuit, wherein the second strength control circuit is configured to set a strength of the second injection current based on a second control code, and wherein the first injection current and the second injection current are combined at the node.

2. The system of claim 1, wherein the first control code and the second control code are complementary.

3. The system of claim 1, wherein the oscillator includes a first stage and a second stage, and the node is coupled between an output of the first stage and an input of the second stage.

4. The system of claim 1, wherein the first input circuit comprises a first input transistor, wherein a gate of the first input transistor is configured to receive the first clock signal, and wherein the first strength control circuit is coupled between the node and a drain of the first input transistor.

5. The system of claim 4, wherein the second input circuit comprises a second input transistor, wherein a gate of the second input transistor is configured to receive the second clock signal, and wherein the second strength control circuit is coupled between the node and a drain of the second input transistor.

6. The system of claim 5, wherein the first control code and the second control code are complementary.

7. The system of claim 5, wherein the first strength control circuit comprises:

first transistors coupled in parallel between the node and the drain of the first input transistor; and a first controller configured to control a number of the first transistors that are turned on based on the first control code.

8. The system of claim 7, wherein the second strength control circuit comprises:

second transistors coupled in parallel between the node and the drain of the second input transistor; and a second controller configured to control a number of the second transistors that are turned on based on the second control code.

9. The system of claim 8, wherein the first control code and the second control code are complementary.

10. The system of claim 5, wherein a source of the first input transistor is coupled to a ground, and a source of the second input transistor is coupled to the ground.

11. The system of claim 10, wherein the first input transistor comprises a first n-type field effect transistor (NFET) and the second input transistor comprises a second NFET.

12. A system, comprising:

an oscillator; and a first injection circuit coupled to the oscillator, wherein the first injection circuit comprises:

a first multiplexer configured to receive multiple clock signals, select a first clock signal and a second clock signal from among the multiple clock signals, and output the first clock signal and the second clock signal;

a first injection branch coupled to a first node, wherein the first injection branch is configured to receive the first clock signal from the first multiplexer and generate a first injection current based on the first clock signal; and a second injection branch coupled to the first node, wherein the second injection branch is configured to receive the second clock signal from the first multiplexer and generate a second injection current based on the second clock signal, and wherein the first injection current and the second injection current are combined at the first node; and a second injection circuit coupled to the oscillator, wherein the second injection circuit comprises:

a second multiplexer configured to receive the multiple clock signals, select a third clock signal and a fourth clock signal from among the multiple clock signals, and output the third clock signal and the fourth clock signal, wherein the first clock signal, the second clock signal, the third clock signal, and the fourth clock signal are phase offset from one another;

a third injection branch coupled to a second node, wherein the third injection branch is configured to receive the third clock signal from the second multiplexer and generate a third injection current based on the third clock signal; and a fourth injection branch coupled to the second node, wherein the fourth injection branch is configured to receive the fourth clock signal from the second multiplexer and generate a fourth injection current based on the fourth signal, and wherein the third injection current and the fourth injection current are combined at the second node.

13. The system of claim 12, wherein the first node and the second node are coupled to different nodes of the oscillator.

14. The system of claim 12, wherein the multiple clock signals are phase offset from one another.

15. The system of claim 14, wherein the multiple clock signals are phase offset from one another by 45 degrees.

16. The system of claim 12, further comprising a multi-phase generator configured to receive one or more input clock signals, generate the multiple clock signals based on the one or more input clock signals, and output the multiple clock signals to the multiplexer.

17. The system of claim 16, wherein the one or more input clock signals comprise complementary clock signals.

18. A system, comprising:

an oscillator; and an injection circuit coupled to the oscillator, wherein the injection circuit comprises:

a first injection branch coupled to a node, wherein the first injection branch comprises:

a first input circuit configured to receive a first clock signal and generate a first injection current based on the first clock signal; and a first strength control circuit coupled between the node and the first input circuit; and a second injection branch coupled to the node, wherein the second injection branch comprises:

a second input circuit configured to receive a second clock signal and generate a second injection current based on the second clock signal; and a second strength control circuit coupled between the node and the second input circuit, wherein the first injection current and the second injection current are combined at the node to obtain a combined injection current, and wherein the first strength control circuit and the second strength control circuit are configured to adjust the first injection current and the second injection current, respectively, in opposite directions to adjust a phase of the combined injection current.

19. The system of claim 18, wherein:

the first strength control circuit comprises:

first transistors coupled in parallel between the node and the first input circuit; and a first controller configured to control a number of the first transistors that are turned on;

the second strength control circuit comprises:

second transistors coupled in parallel between the node and the second input circuit; and a second controller configured to control a number of the second transistors that are turned on such that a total number of the first transistors and the second transistor that are turned on is constant across phase rotations of the combined injection current.

20. The system of claim 18, wherein the oscillator includes a first stage and a second stage, and the node is coupled between an output of the first stage and an input of the second stage.

21. The system of claim 18, wherein the first clock signal and the second clock signal are phase offset from one another by 45 degrees.

22. The system of claim 18, wherein:

the first input circuit comprises a first input transistor, wherein a gate of the first input transistor is configured to receive the first clock signal, and wherein the first strength control circuit is coupled between the node and a drain of the first input transistor; and the second input circuit comprises a second input transistor, wherein a gate of the second input transistor is configured to receive the second clock signal, and wherein the second strength control circuit is coupled between the node and a drain of the second input transistor.

* * * * *